US009559716B1

United States Patent
Matsui et al.

(10) Patent No.: US 9,559,716 B1
(45) Date of Patent: Jan. 31, 2017

(54) AD CONVERTER, AD CONVERT APPARATUS, AND AD CONVERT METHOD

(71) Applicant: Renesas Electronics Corporation, Tokyo (JP)

(72) Inventors: Tetsuo Matsui, Tokyo (JP); Hiroto Suzuki, Tokyo (JP); Masaki Fujiwara, Tokyo (JP); Tetsuro Matsuno, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/197,447

(22) Filed: Jun. 29, 2016

(30) Foreign Application Priority Data

Aug. 28, 2015 (JP) .................................. 2015-168502

(51) Int. Cl.
*H03M 1/06* (2006.01)
*H03M 1/46* (2006.01)
*H03M 1/12* (2006.01)

(52) U.S. Cl.
CPC ............... *H03M 1/46* (2013.01); *H03M 1/124* (2013.01)

(58) Field of Classification Search
CPC .......... H03M 1/46; H03M 1/124; H03M 1/00; H03M 1/50; H03M 1/0612; H03M 1/1038; H03M 1/1215; H04L 7/0087; H04L 25/08; H04W 56/00
(Continued)

(56) References Cited

U.S. PATENT DOCUMENTS 4,415,882 A * 11/1983 Akazawa ............... H03M 1/069
341/156
4,764,750 A * 8/1988 Kawada ............... H03M 1/0678
341/122
(Continued)

FOREIGN PATENT DOCUMENTS

JP 5-167449 A 7/1993
JP 3224808 B2 11/2001
(Continued)

OTHER PUBLICATIONS

Lee, H. et al., "A Self-Calibrating 15bit CMOS A/D Converter", IEEE Solid State Circuits, vol. 19, No. 6. Dec. 1984.
(Continued)

*Primary Examiner* — Jean B Jeanglaude
(74) *Attorney, Agent, or Firm* — McDermott Will & Emery LLP

(57) ABSTRACT

A processing speed can be improved while the accuracy of AD conversion is enhanced. An AD converter includes: a higher-order DAC that samples an analog input signal and performs DA conversion corresponding to higher-order bits of a digital output signal; an extension DAC that performs DA conversion to positive and negative polarities on an extension bit for expanding bits of the higher-order DAC; a lower-order DAC that performs DA conversion corresponding to lower-order bits of the digital output signal; a comparator that compares a comparison reference voltage with output voltages of the higher-order DAC, the extension DAC, and the lower-order DAC; and a successive approximation logic that controls successive approximation performed by the higher-order DAC, the extension DAC, and the lower-order DAC based on a comparison result of the comparator and generates the digital output signal.

19 Claims, 24 Drawing Sheets

(58) Field of Classification Search
USPC .................. 341/118, 120, 155, 156, 122, 172
See application file for complete search history.

(56) References Cited

U.S. PATENT DOCUMENTS

| | | | |
|---|---|---|---|
| 4,970,514 A | 11/1990 | Draxelmayr | |
| 7,038,609 B1* | 5/2006 | Hurrell | H03M 1/145 |
| | | | 341/156 |
| 7,218,259 B2 | 5/2007 | Hurrell et al. | |
| 7,605,741 B2 | 10/2009 | Hurrell | |
| 2006/0021491 A1* | 2/2006 | Greco | H03L 7/0995 |
| | | | 84/293 |
| 2008/0036641 A1* | 2/2008 | Confalonieri | H03M 1/0682 |
| | | | 341/172 |
| 2011/0109488 A1* | 5/2011 | Nakajima | H03M 1/1004 |
| | | | 341/120 |
| 2014/0285370 A1* | 9/2014 | Miki | H03M 1/0641 |
| | | | 341/172 |

FOREIGN PATENT DOCUMENTS

| | | |
|---|---|---|
| JP | 4806021 B2 | 11/2011 |
| JP | 4890561 B2 | 3/2012 |
| JP | 5565169 B2 | 8/2014 |

OTHER PUBLICATIONS

Nakane, H. et al., "A Fully Integrated SAR ADC Using Digital Correction Technique for Triple-Mode Mobile", ASSCC, Session 5-2, Nov. 2013.

* cited by examiner

<EXAMPLE INCLUDING NO EXTENSION DAC>

<EXAMPLE INCLUDING EXTENSION DAC>

AD CONVERTER, AD CONVERT APPARATUS, AND AD CONVERT METHOD

CROSS-REFERENCE TO RELATED APPLICATIONS

This application is based upon and claims the benefit of priority from Japanese patent application No. 2015-168502, filed on Aug. 28, 2015, the disclosure of which is incorporated herein in its entirety by reference.

BACKGROUND

The present invention relates to an AD converter, an AD convert apparatus, and an AD convert method. For example, the present invention relates to an AD converter, an AD convert apparatus, and an AD convert method which perform successive approximation.

A successive approximation register (SAR) ADC (SAR-ADC) is known as an ADC (an A/D converter: an analog/digital converter) that converts an input analog signal into a digital signal. The SAR-ADC mainly includes a DAC (a D/A converter: a digital/analog converter), a comparator, and a successive approximation logic circuit. The SAR-ADC performs AD conversion by sampling and holding an input analog signal and performing a successive approximation operation on the input analog signal, and outputs a digital signal as a result of the successive approximation. As a related art of the SAR-ADC, for example, H. Lee et. al., "A Self-Calibrating 15 bit CMOS A/D Converter", IEEE Solid State Circuits, vol. sc-19, No. 6, December 1984 (hereinafter referred to as "Non Patent Literature 1"); Hideo Nakane et. al., "A Fully Integrated SAR ADC Using Digital Correction Technique for Triple-Mode Mobile", ASSOC, Session 5-2 November 2013 (hereinafter referred to as "Non Patent Literature 2"); Japanese Unexamined Patent Application Publication No. H05-167449; and Japanese Patent Nos. 3224808, 4806021, 4890561, and 5565169 are known.

To achieve an accuracy required for a high-accuracy SAR-ADC, a high relative accuracy is required for analog elements (capacitors and resistors) constituting a built-in DAC. However, to achieve, for example, a 14-bit or higher ADC, the device size necessary for securing the relative accuracy (pair accuracy) of the analog elements increases. Accordingly, in the ADC of the related art, it is necessary to increase the relative accuracy by increasing the element area.

Non Patent Literature 1 discloses an ADC that calibrates errors in analog elements so as to increase the relative accuracy of the analog elements. Non Patent Literature 1, Japanese Unexamined Patent Application Publication No. H05-167449, and Japanese Patent No. 5565169 employ a technique in which a mismatch between elements is obtained as a digital value and the digital value is fed back in an analog fashion during AD conversion processing.

Non Patent Literature 2 discloses a digital correction ADC that uses a non-binary-weighted capacitive DAC and an LMS (Least Mean Square) engine. Non Patent Literature 2 and Japanese Patent. No. 3224808 employ a technique in which a result of a mismatch between elements is obtained as a digital value and the digital value is corrected in a digital fashion after AD conversion. Japanese Patent No. 3224808 discloses an example of the digital correction in which the technique disclosed in Non Patent Literature 1 is applied to a non-binary-weighted DAC with redundancy.

In addition, Japanese Patent Nos. 4806021 and 4890561 discloses an ADC to reduce thermal noise.

SUMMARY

However, the present inventors have found that an improvement in the accuracy of the conversion in the ADCs of the related art may adversely affect the processing speed thereof. Accordingly, the ADCs of the related art have a problem that it is difficult to improve the processing speed while achieving a high accuracy.

Other problems to be solved by and novel features of the present invention will become apparent from the following description and the accompanying drawings.

According to one embodiment, an AD converter includes a higher-order DAC, an extension DAC, a lower-order DAC, a comparator, and a successive approximation logic circuit. The higher-order DAC samples an analog input signal and performs DA conversion corresponding to higher-order bits of a digital output signal. The extension DAC performs DA conversion to positive and negative polarities on an extension bit for expanding bits of the higher-order DAC. The lower-order DAC performs DA conversion corresponding to lower-order bits of the digital output signal. The comparator compares a comparison reference voltage with an output voltage of each of the higher-order DAC, the extension DAC, and the lower-order DAC. The successive approximation logic circuit controls the successive approximation performed by the higher-order DAC, the extension DAC, and the lower-order DAC, based on a comparison result of the comparator, and generates the digital output signal.

According to the one embodiment, it is possible to improve a processing speed while achieving a high accuracy of AD conversion.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Figure 1:
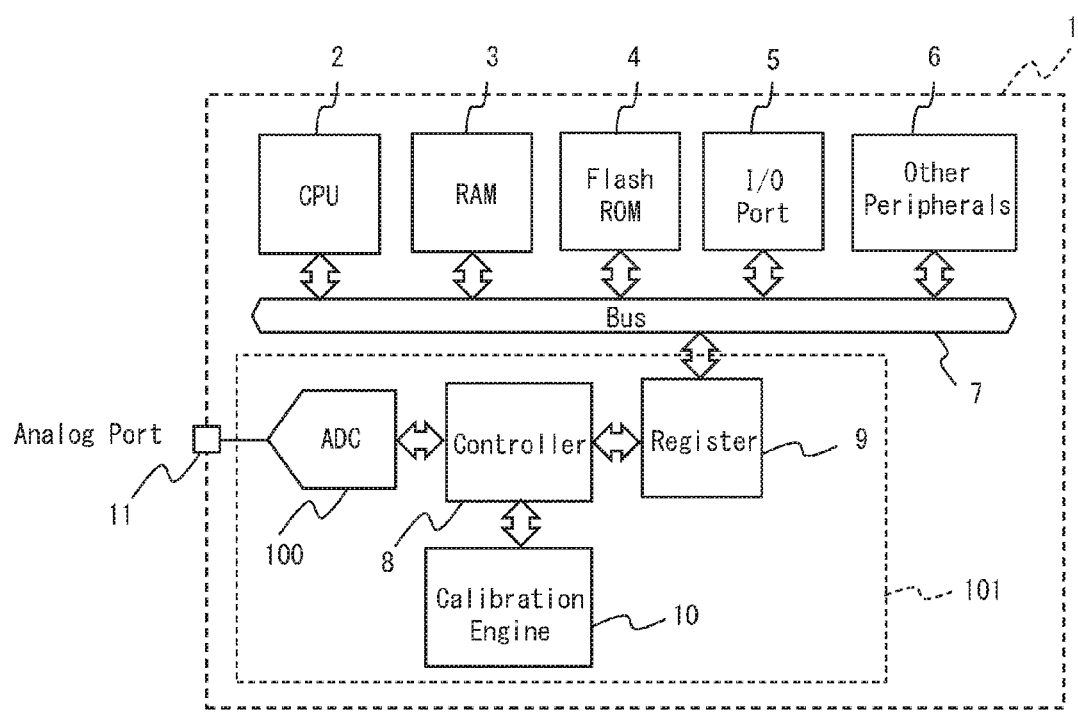
FIG. 1 is a block diagram showing a configuration example of an MCU according to a first embodiment.

The following description and the drawings are abbreviated or simplified as appropriate for clarity of explanation. The elements illustrated in the drawings as functional blocks for performing various processes can be implemented hardwarewise by a CPU, a memory, and other circuits, and softwarewise by a program loaded into a memory. Accordingly, it is understood by those skilled in the art that these functional blocks can be implemented in various forms including, but not limited to, hardware alone, software alone, and a combination of hardware and software. Note that in the drawings, the same elements are denoted by the same reference numerals, and repeated descriptions thereof are omitted as needed.

(Investigation Leading to Embodiments)

As described above, in order to increase a relative accuracy without performing a correction by calibration in an SAR-ADC, it is necessary to increase the area of analog elements. For example, capacitor elements are used as the analog elements constituting the SAR-ADC. When the capacitance of each capacitor element is increased to improve the accuracy of the SR-ADC, an increase in the capacitance of each element, as well as an increase in element area causes deterioration in processing speed and an increase in power consumption due to charge and discharge. Thus, the area, power, and speed of the SAR-ADC are scarified as a trade-off for a high accuracy.

In the technique for correcting errors in analog elements as typified by Non Patent Literature 1, Japanese Unexamined Patent Application Publication No. H05-167449, and Japanese Patent No. 5565169, it is necessary for the DAC that provides a correction value to perform a step-by-step operation during AD conversion. Accordingly, it is necessary to increase the area of the DAC for correction and to perform arithmetic processing for converting each AD conversion value into a correction code, which incurs an overhead in terms of processing speed.

As disclosed in Non Patent Literature 2, there is a method for correcting an error in post-processing after AD conversion by using an AD conversion result. In this method, a non-binary-weighted DAC with redundancy is used. For example, this method uses a characteristic that the redundancy of the DAC allows the value of a local DAC obtained as a result of a final conversion of the SAR-ADC to be set to an output corresponding to an analog input value, even if the relative accuracy does not meet the accuracy required by the ADC. Performing a correction in post-processing makes it possible to solve the overhead in terms of circuit configuration and processing speed during normal AD conversion. In this method, however, it is necessary to, for example, derive a correction coefficient during the correction in post-processing by using the LMS engine that performs complicated statistical processing. Thus, the method has a problem that as the gate area of an arithmetic circuit for deriving a correction coefficient increases, a longer correction time is required for statistical processing.

The following embodiments make it possible to prevent adverse effects on the processing speed and the like, while achieving a high accuracy. Specifically, it is possible to provide an ADC that facilitates design of a DAC and is capable of performing AD conversion using a binary DAC with simple operation.

First Embodiment

A first embodiment will be described below with reference to the drawings.

<Outline of First Embodiment>

In the first embodiment, a power-of-two-weighted (binary-weighted) redundant element (extension DAC) is added to a local DAC which is composed of power-of-two-weighted (binary-weighted) analog elements. With this configuration, the output range of the local DAC is expanded and the number of times of comparison is increased, thereby providing a successive approximation ADC with the redundancy of the power-of-two-weighted redundant element that is additionally provided.

The configuration of the binary-weighted DAC enables the derivation of the error correction in the same manner as in Non Patent Literature 1. However, since the ADC of the first embodiment has redundancy, there is no need to perform the error correction for the DAC every time a comparison is made, unlike in Non Patent Literature 1. Therefore, a correct conversion result can be obtained by subtracting the error in the DAC from the digital code of the final conversion result.

This eliminates the need for arithmetic processing and accessing a register to obtain a correction value during the comparison, which leads to an improvement in conversion rate. As one feature, a reference DAC for correction (correction target DAC) also serves as a lower-order DAC, and thus there is no need to separately provide a DAC for correction. The error in the reference DAC can be corrected by a particular correction coefficient calculation method.

The correction result can be stored in a register and is accessible from the outside. The correction result can also be transferred to a flash-ROM through the register and stored in the flash-ROM. During screening of a semiconductor device, the correction result is stored in the flash-ROM and loaded into the register upon activation of the semiconductor device, thereby making it possible to perform an AD conversion operation without deriving the correction coefficient.

For example, the basic main components of the first embodiment include: a DAC including binary-weighted elements; a binary-weighted extension DAC having positive and negative polarities; a lower-order DAC used as a correction reference; a comparator; a successive approximation logic; a correction coefficient derivation logic (calibration engine); a correction result arithmetic logic (correction value calculation circuit); a correction coefficient storage register; and an ADC control logic (controller).

<Configuration of MCU>

FIG. 1 shows a configuration example of an MCU (Micro Control Unit) according to the first embodiment. The MCU is an example of a semiconductor device. The MCU may be a semiconductor device including an ADC according to the first embodiment.

As shown in FIG. 1, an MCU 1 according to the first embodiment includes a CPU (Central Processing Unit) 2, a RAM (Random Access Memory) 3, a flash-ROM (Read Only Memory) 4, an I/O port 5, other peripherals 6, a bus 7, an analog port 11, an ADC (AD converter) 100, a controller 8, a register 9, and a calibration engine 10.

The CPU 2, the RAM 3, the flash-ROM 4, the I/O port 5, the other peripherals 6, and the register 9 are connected via the bus 7. An input terminal of the ADC 100 is connected to the analog port 11, and an output terminal (and a control terminal) of the ADC 100 is connected to the controller 8. The controller 8 is also connected to each of the calibration engine 10 and the register 9.

The CPU 2 is an arithmetic processing unit that implements functions necessary for the MCU 1. The CPU 2 accesses the RAM 3 and the flash-ROM 4 and executes various programs, to thereby execute arithmetic processing on the AD conversion result of the ADC 100 that is stored in the register 9, input and output signals through the I/O port, and input and output signals through the other peripherals 6.

For example, the ADC 100, the controller 8, the register 9, and the calibration engine 10 constitute an AD conversion unit (AD convert apparatus) 101 that performs an AD conversion and correction (calibration). The ADC 100, the controller (correction unit) 8, and the register 9 may constitute the AD conversion unit 101.

The ADC 100 is an AD converter which is a main feature of the first embodiment. The ADC 100 performs AD conversion on an analog input signal which is input to the analog port 11 from the outside of the MCU, and outputs a digital output signal as a result of the AD conversion. The controller 8 is a control circuit that controls the operation of the ADC 100 and exchange of data between the calibration engine 10 and the register 9. The ADC 100 operates according to the control from the controller 8, and outputs the AD conversion result before correction. The controller 8 executes correction processing on the AD conversion result of the ADC 100.

The calibration engine 10 executes a calibration operation (processing) for the ADC 100. The calibration operation is an operation for correcting an error in the ADC. Specifically, in the calibration operation, a correction coefficient to correct the AD conversion result of the ADC is calculated. For example, a signal from the calibration engine 10 is transmitted to the ADC 100 through the controller 8, to thereby control the operation of the ADC 100 necessary for the calibration operation. The calibration engine 10 may directly control the ADC 100 without involving the controller 8.

A corrected AD conversion result or a correction coefficient necessary for correction is stored in the register 9 through the controller 8, and is used for control processing of the MCU 1. The correction coefficient is transferred from the register 9 to the flash-ROM 4, and the value of the correction coefficient can be held in the flash-ROM 4 even after a power supply is out off. By loading the value from the flash-ROM 4 upon a subsequent startup of the MCU, the ADC 100 can omit the calculation for correction (calibration), and thus can start the AD conversion operation immediately.

<Correction Coefficient Write/Read Operation>

FIGS. 2A to 2D each show a correction coefficient read/write operation of the ADC 100 in the MCU 1 according to the first embodiment. In the first embodiment, an error $\epsilon$ in the capacitance of the ADC 100 is used as a correction coefficient, and the correction coefficient read/write operation is performed using the flash-ROM 4. For example, calibration is performed during a screening test in the production process of the MCU 1, and AD conversion is performed without performing calibration after shipment of the MCU 1.

Figure 2A:
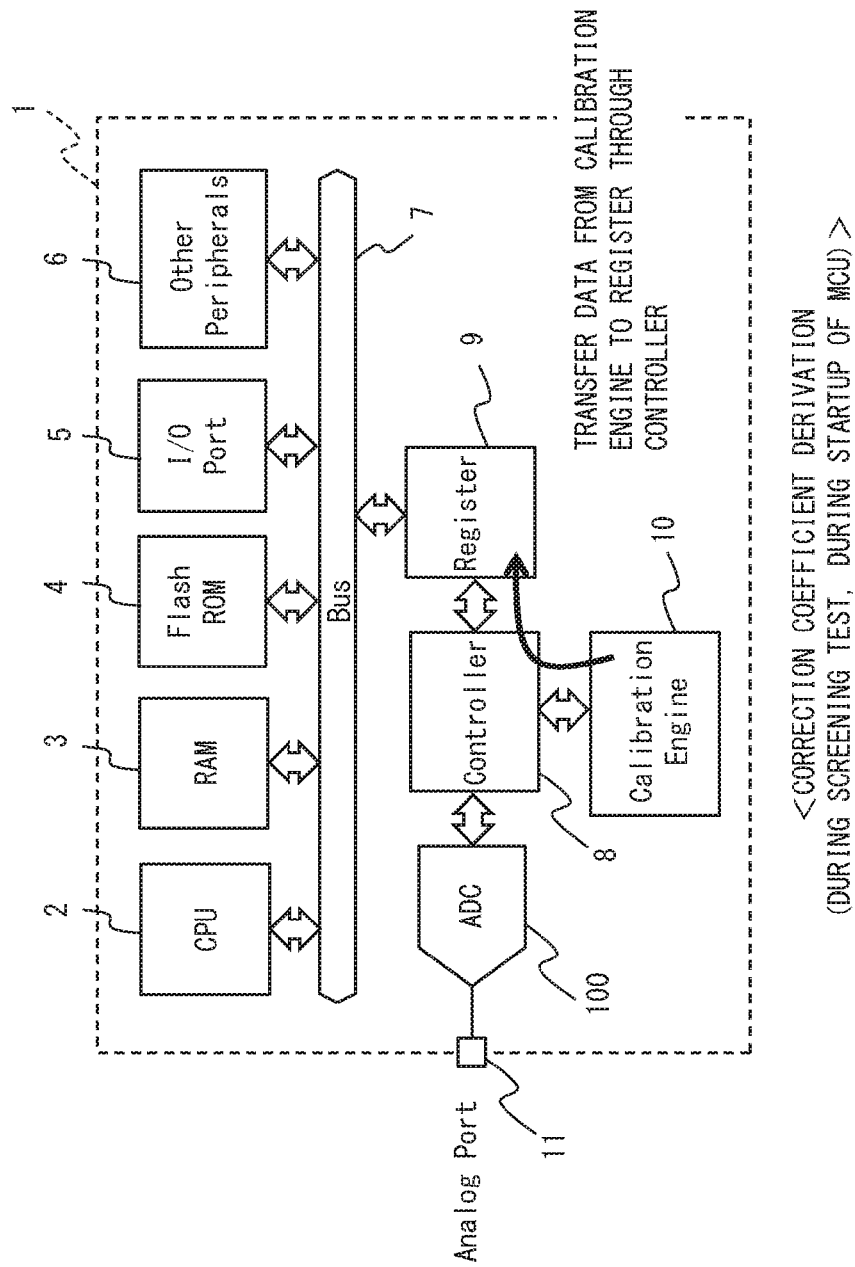
FIG. 2A is a diagram for explaining an operation of the MCU according to the first embodiment.
Figure 2B:
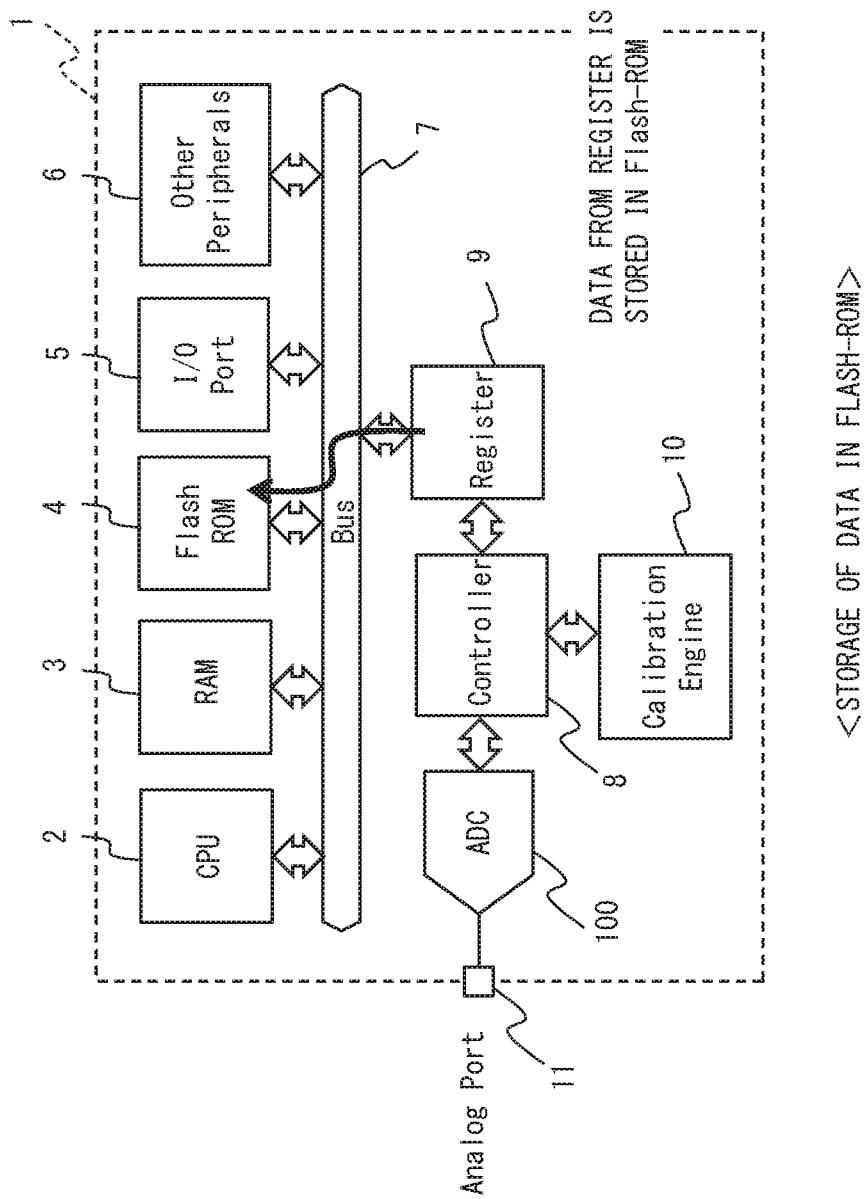
FIG. 2B is a diagram for explaining an operation of the MCU according to the first embodiment.

As shown in FIG. 2A, when the MCU 1 is started during a screening test, the calibration engine 10 executes calibration processing for the ADC 100 and derives the correction coefficient. The calibration engine 10 transfers the derived correction coefficient to the register 9, and stores the correction coefficient in the register 9. Subsequently, as shown in FIG. 2B, the register 9 writes the correction coefficient into the flash-ROM 4 and stores the correction coefficient in the flash-ROM 4. Since the flash-ROM 4 is a non-volatile memory, the flash-ROM 4 can hold the value of the correction coefficient even when the power supply of the MCU 1 is cut off.

Figure 2C:
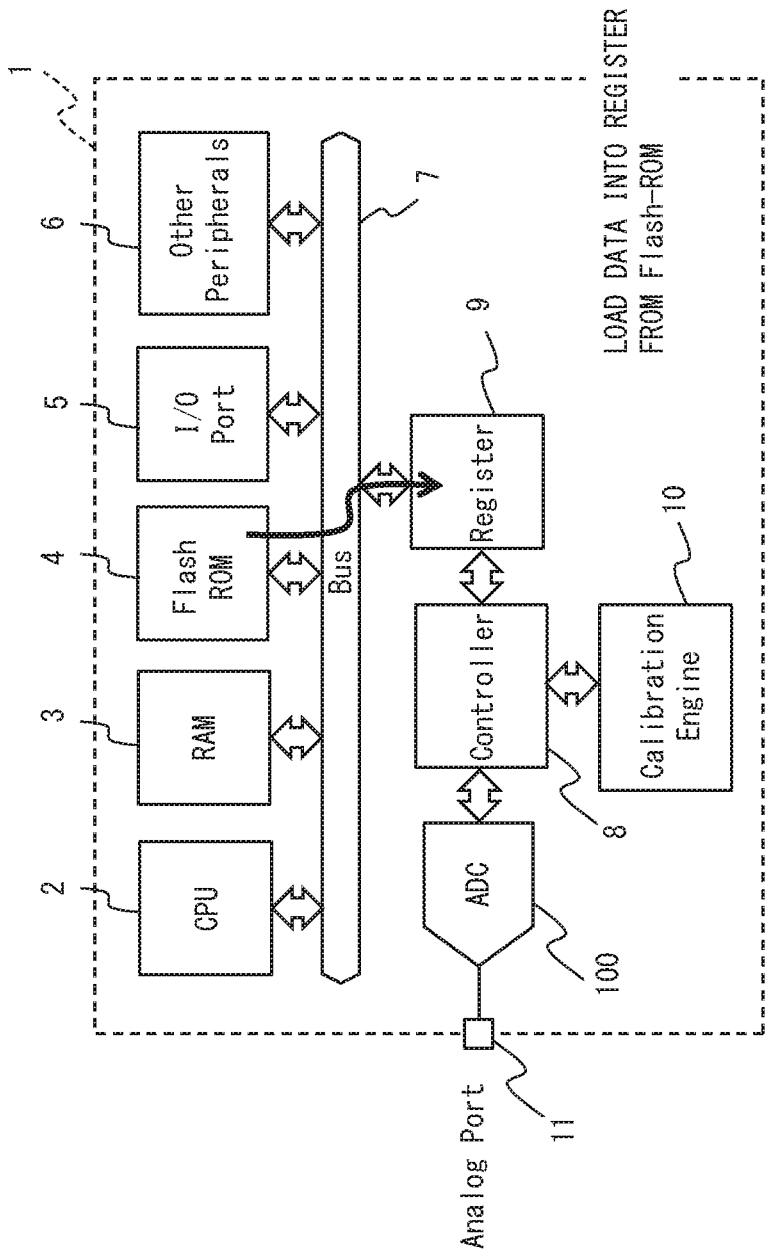
FIG. 2C is a diagram for explaining an operation of the MCU according to the first embodiment.
Figure 2D:
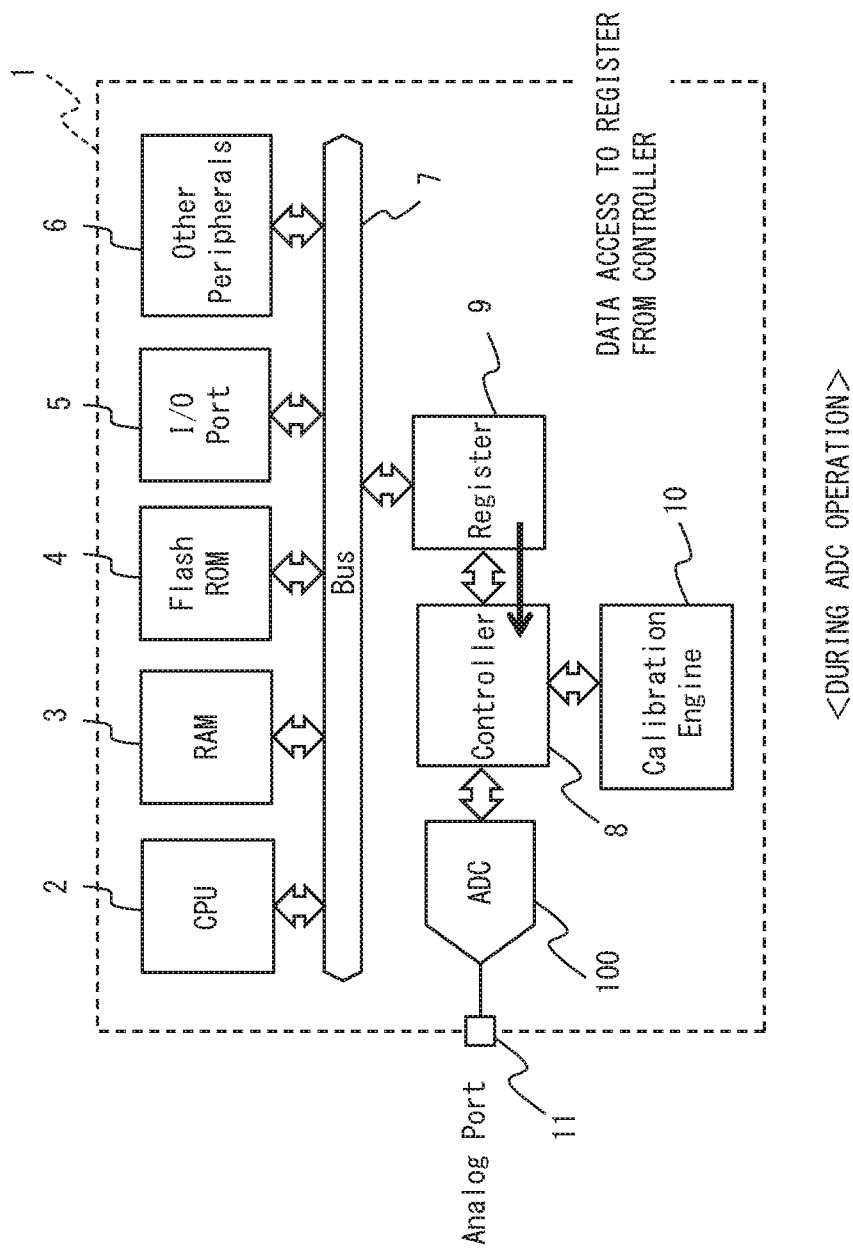
FIG. 2D is a diagram for explaining an operation of the MCU according to the first embodiment.

After that, as shown in FIG. 2C, when the MCU 1 is started, for example, after shipment of the MCU 1, the register 9 loads the correction coefficient from the flash-ROM 4 and holds the correction coefficient. Subsequently, as shown in FIG. 2D, when the ADC 100 performs AD conversion, the controller 8 acquires the correction coefficient loaded into the register 9, and performs correction processing on the AD conversion result by using the acquired correction coefficient.

Since the error $\epsilon$ calculated in the first embodiment is caused due to a mismatch between capacitances, the power supply voltage drift, temperature drift, or the like is small. Accordingly, if the correction coefficient (error $\epsilon$) obtained during mass production and screening of the MCU is stored in the flash-ROM, there is no need to derive the correction coefficient every time the MCU is started, and thus the time required for deriving the correction coefficient upon start-up of the MCU can be reduced. If the error $\epsilon$ varies due to a change in use environment, aged deterioration, or the like, the calibration may be executed again at a necessary timing after shipment of the MCU 1 to update the correction coefficient.

<Configuration of ADC>

Figure 3:
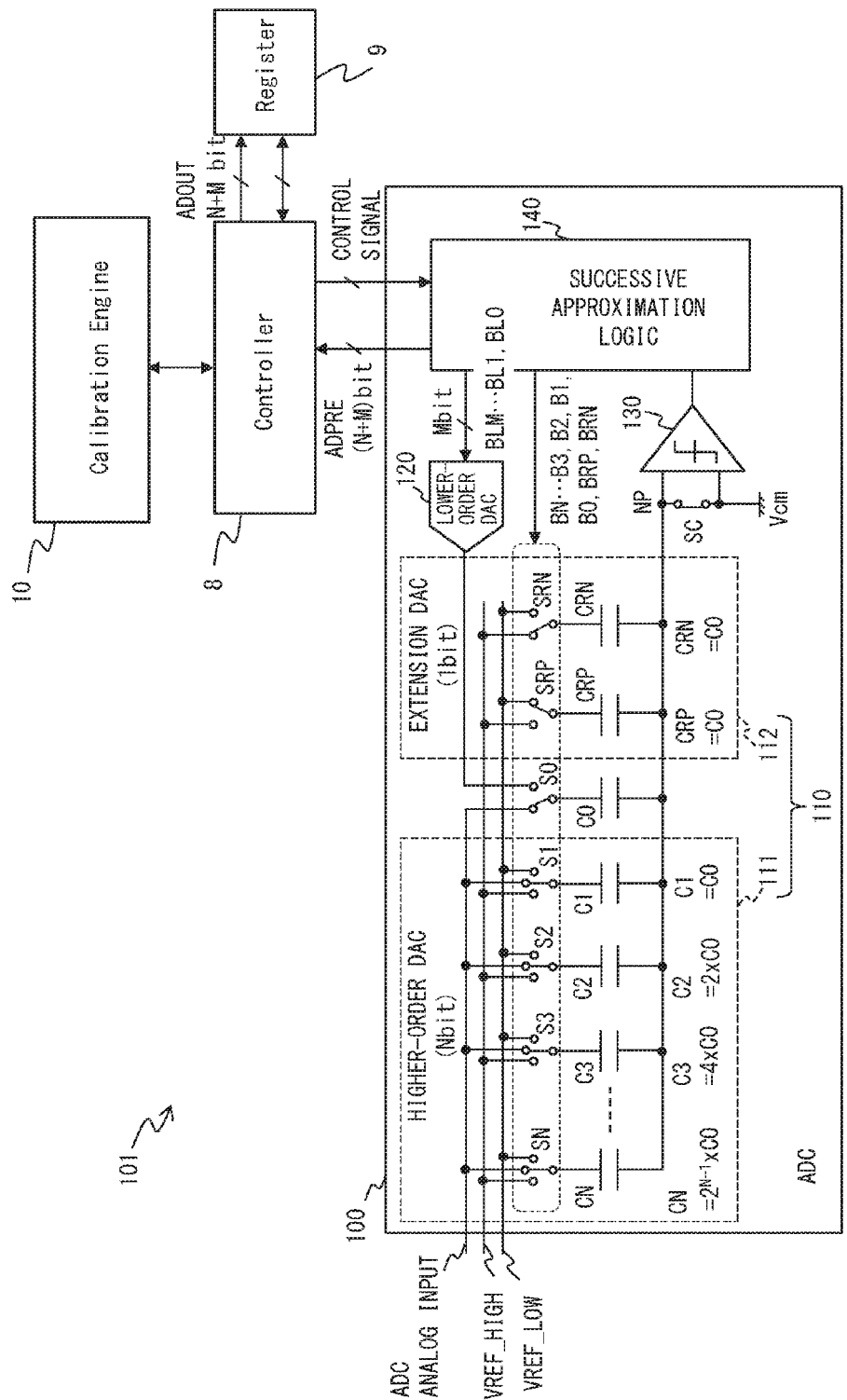
FIG. 3 is a block diagram showing a configuration example of an ADC according to the first embodiment.

FIG. 3 shows a configuration example of the ADC according to the first embodiment. The ADC 100 is a charge redistribution SAR-ADC (successive approximation ADC) having a configuration similar to that of the ADCs disclosed in Non Patent Literature 1 and the like. In this example, the ADC 100 performs AD conversion on an ADC analog input signal into an (N+N)-bit digital output signal (ADPRE).

As shown in FIG. 3, the ADC 100 according to the first embodiment includes a local DAC 110, a lower-order DAC 120, a comparator 130, and a successive approximation logic 140. The local DAC 110 includes a higher-order DAC 111 and an extension DAC 112.

The local DAC 110 is a capacitive DAC that samples an analog input signal and redistributes the sampled charge. The local DAC 110 includes capacitor elements CN . . . C0, CRP, and CRN and switches SN . . . S0, SRP, and SRN.

The capacitor elements CN . . . C0, CRP, and CRN are connected in parallel between the switches SN . . . S0, SRP, and SRN and a node NP (one of input terminals of the comparator 130). The switches SN . . . S1 are provided between the capacitor elements CN . . . C1 and each of an input terminal for the ADC analog input signal, a supply terminal for a reference voltage VREF_HIGH, and a supply terminal for a reference voltage VREF_LOW. The switch S0 is provided between the capacitor element C0 and each of the input terminal for the ADC analog input signal and an output terminal of the lower-order DAC 120. The switches SRP and SRN are provided between the capacitor elements CRP and CRN and each of the supply terminal for the reference voltage VREF_HIGH and the supply terminal for the reference voltage VREF_LOW.

Switching operations of the switches SN . . . S0, SRP, and SRN are respectively controlled by successive approximation control signals BN . . . B1, B0, BRP, and BRN, which are output from the successive approximation logic 140. The switches SN . . . S1, SRP, and SRN switch the connections between the capacitor elements CN . . . C1, CRP, and CRN and each of the reference voltage VREF_HIGH, the reference voltage VREF_LOW, and the ADC analog input signal according to the successive approximation control signals BN . . . B1, BRP, and BRN. The switch S0 switches the connection between the capacitor element C0 and each of the ADC analog input signal and the output signal of the lower-order DAC 120 according to the successive approximation control signal B0.

The lower-order DAC 120 is an M-bit DAC. The lower-order DAC 120 performs DA conversion on successive approximation control signals BLM . . . BL0, which are output from the successive approximation logic 140, and supplies analog signals obtained as a result of the DA conversion to the capacitor element C0 via the switch S0. The lower-order DAC 120 (and the capacitor element C0) performs DA conversion corresponding to lower-order bits (M bits) of the digital output signal. The capacitor element (coupling capacitor element) C0 and the switch (coupling switch) S0 may be or may not be included in the lower-order DAC 120. The capacitor element C0 has the same capacity as that of the capacitor element corresponding to the least significant bit of the higher-order DAC.

The higher-order DAC 111 is an N-bit DAC, and includes the capacitor elements CN . . . C1 (higher-order capacitor element group) and the switches SN . . . S1 (higher-order switch group). The capacitor elements CN . . . C1 each have a capacitance of a weight that is a power-of-two multiple of the reference capacitor element C0. The capacitances of the capacitor elements CN . . . C0are also referred to as capacitances CN . . . C0 (or simply as CN . . . C0), respectively. Specifically, the capacitance of the capacitor element C1 at the least significant bit is represented by C0, and the capacitance of the capacitor element CN at the most significant bit is represented by $2^{N-1} \times C0$. The higher-order DAC 111 samples the analog input signal according to the successive approximation control signals BN . . . B1 and performs DA conversion corresponding to the higher-order bits (N bits) of the digital output signal.

The extension DAC 112 is a 1-bit DAC for providing the DAC (for example, the bits of the higher-order DAC) with redundancy, and includes the capacitor elements (extension capacitor elements) CRP and CRN and the switches (extension switches) SRP and SRN. The capacitor elements CRP and CRN each have a capacitance of a weight that is a power-of-two multiple of the weight of the reference capacitor element C0 so that the capacitance of each of the capacitor elements CRP and CRN matches the capacitance of any one of the capacitor elements in the higher-order DAC. In other words, each of the capacitor elements CRP and CRN has a capacitance equal to that of any one of the capacitor elements in the higher-order DAC, and the capacitance of each of the capacitor elements CRP and CRN is set to C0 in this example. The extension DAC 112 has positive and negative polarities, and each of the capacitor elements CRP and CRN has positive and negative polarities. The positive polarity and the negative polarity respectively indicate the positive side and the negative side of the input or output of the DAC. It can be said that, in this example, the DAC is expanded by one bit to each of the positive side and the negative side. For example, the capacitor element CRP is connected to the reference voltage VREF_LOW, and the capacitor element CRN is connected to the reference voltage VREF_HIGH. The extension DAC 112 corresponds to an extension bit for expanding the bits of the higher-order DAC 111, and performs DA conversion to the positive and negative polarities (first and second potentials).

The comparator 130 compares a comparison reference voltage Vcm (comparison reference voltage) with an output voltage of each of the higher-order DAC 111, the extension DAC 112, and the lower-order DAC 120. One of the input terminals of the comparator 130 is connected to the capacitor elements CN . . . C0, CRP, and CRN, and the other one of the input terminals of the capacitor 130 is connected to the comparison reference voltage Vcm. An output terminal of the comparator 130 is connected to the successive approximation logic 140. A switch SC is provided between the one (node NP) of the input terminals of the comparator 130 and the other input terminal thereof (comparison reference voltage Vcm). For example, turning on/off of the switch SC is controlled by the controller 8 or the successive approximation logic 140. During a sampling operation, the switch SC is turned on, so that the comparator 130 does not perform the comparison. During the successive approximation operation, the switch SC is turned off, so that the comparator 130 compares the comparison reference voltage Vcm with the charge redistributed by the capacitor elements CN . . . C0, CRP, and CRN, and outputs the comparison result to the successive approximation logic 140.

The successive approximation logic (successive approximation logic circuit) 140 controls the successive approximation performed by the successive approximation control signals BN . . . B1, B0, BRP, BRN, and BLM . . . BL0 based on the comparison result of the comparator 130. The successive approximation logic 140 outputs, to the controller 8, the (N+M)-bit AD conversion result ADPRE before correction as the digital output signal according to the successive approximation result.

Figure 4:
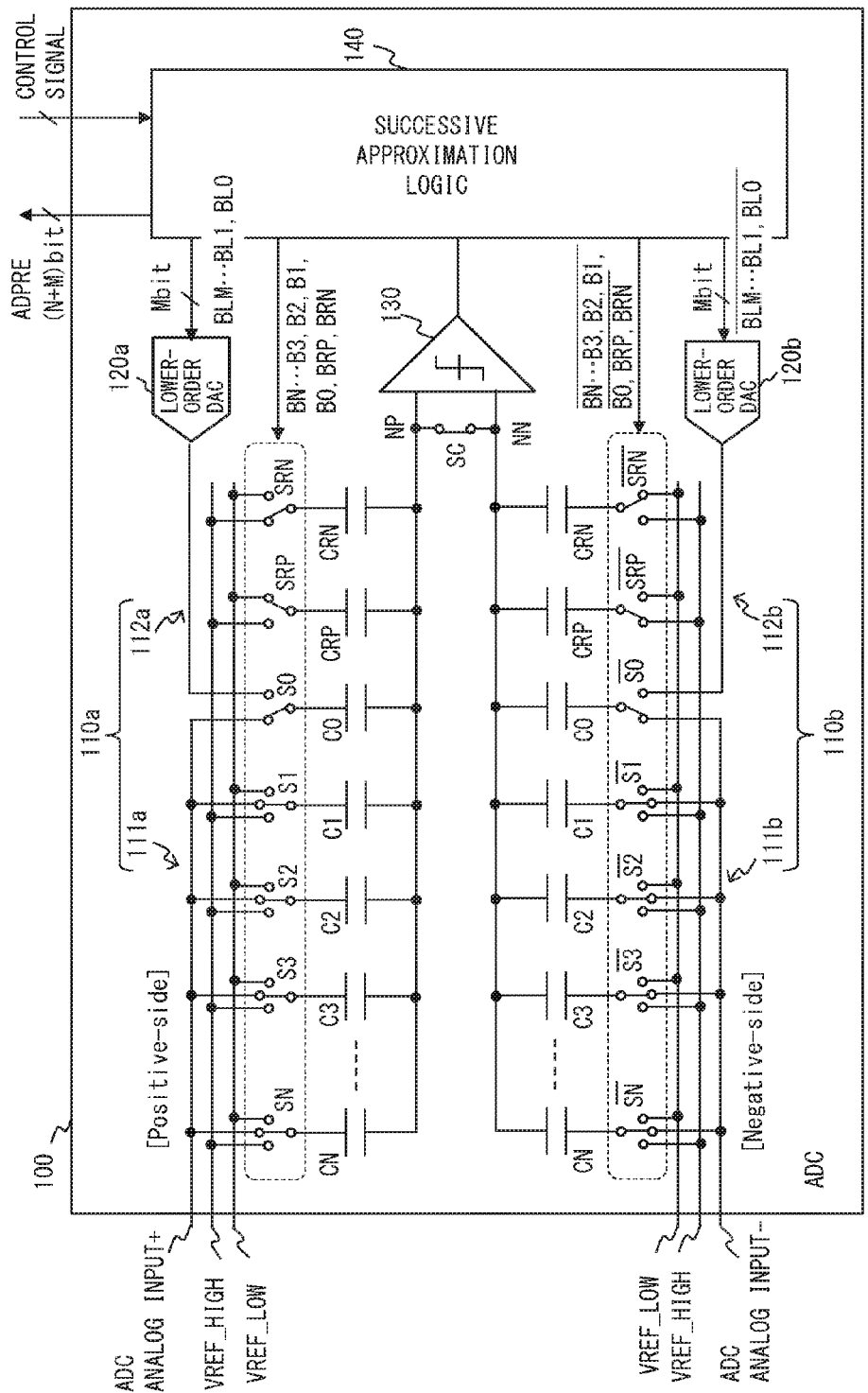
FIG. 4 is a block diagram showing another configuration example of the ADC according to the first embodiment.

The first embodiment illustrates an example in which the ADC has a single end configuration as shown in FIG. 3, but the ADC may be implemented using a fully-differential circuit as shown in FIG. 4. The ADC configured as a fully-different circuit can eliminate noise.

Referring to FIG. 4, the ADC 100 receives differential signals as analog input signals. When the ADC 100 is configured as a fully-differential circuit, a local DAC and a lower-order DAC are provided on each of the positive side and the negative side which correspond to an analog input signal (+) and an analog input signal (−), respectively.

Specifically, the ADC 100 shown in FIG. 4 includes a local DAC 110a, a lower-order DAC 120a, a local DAC 110b, a lower-order DAC 120b, the comparator 130, and the successive approximation logic 140. The local DAC 110a includes a higher-order DAC 111a and an extension DAC 112a. The local DAC 110b includes a higher-order DAC 111b and an extension DAC 112b. The local DAC 110a and the lower-order DAC 120a have the same configuration as that shown in FIG. 3. The local DAC 110b and the lower-order DAC 120b are arranged by simply reversing the local DAC 110a and the lower-order DAC 120a for the negative-side use, and thus the descriptions thereof are omitted.

The comparator 130 compares the charge (node NP) of the capacitor elements CN . . . C0, CRP, and CRN in the local DAC 110a with the charge (node NN) of the capacitor elements CN . . . C0, CRP, and CRN in the local DAC 110b, and outputs the comparison result to the successive approximation logic 140. The successive approximation logic 140 controls the successive approximation of the local DAC 110a and the lower-order DAC 120a by the successive approximation control signals BN . . . B1, B0, BRP, BRN, and BLM . . . BL0 based on the comparison result of the comparator 130, and controls the successive approximation of the local DAC 110b and the lower-order DAC 120b by inverted signals of the successive approximation control signals BN . . . B1, B0, BRP, BRN, and BLM . . . BL0.

The first embodiment can be widely applied to charge redistribution SAR-ADCs using capacitor elements, and is not limited to the configurations of the capacitive DACs, comparators, switches, and the like shown in FIGS. 3 and 4. Although the extension DAC is provided at the least significant bit of the higher-order DAC, the location of the extension DAC is not limited to the examples shown in FIGS. 3 and 4. The extension DAC may be located at any bit position with arbitrary redundancy. In the examples shown in FIGS. 3 and 4, the extension DAC is located so as to provide a (1-bit) redundancy. However, any number of redundancies may be added and a plurality of extension DACs may be located. Also in this case, the same advantageous effects can be obtained by performing a control operation similar to that shown in FIGS. 3 and 4.

<AD Conversion Operation>

Next, as an operation according to the first embodiment, a normal AD conversion operation in a state where a correction coefficient is fixed (after derivation of the correction coefficient) will be described.

In the case of performing AD conversion, the ADC 100 first samples an ADC analog input signal. FIG. 3 shows a state of the ADC during sampling. As shown in FIG. 3, during sampling, all the switches SN . . . S0 select the analog input signal by the control of the successive approximation control signals BN . . . B0. Further, the switch SC is turned on, so that the node NP input from the capacitor elements CN . . . C0 to the comparator 130 is connected to the comparison reference voltage Vcm. At this time, the capacitor elements CRP and CRN of the extension DAC 112 select the reference voltage VREF_LOW and the reference voltage VREF_HIGH, respectively.

Figure 5:
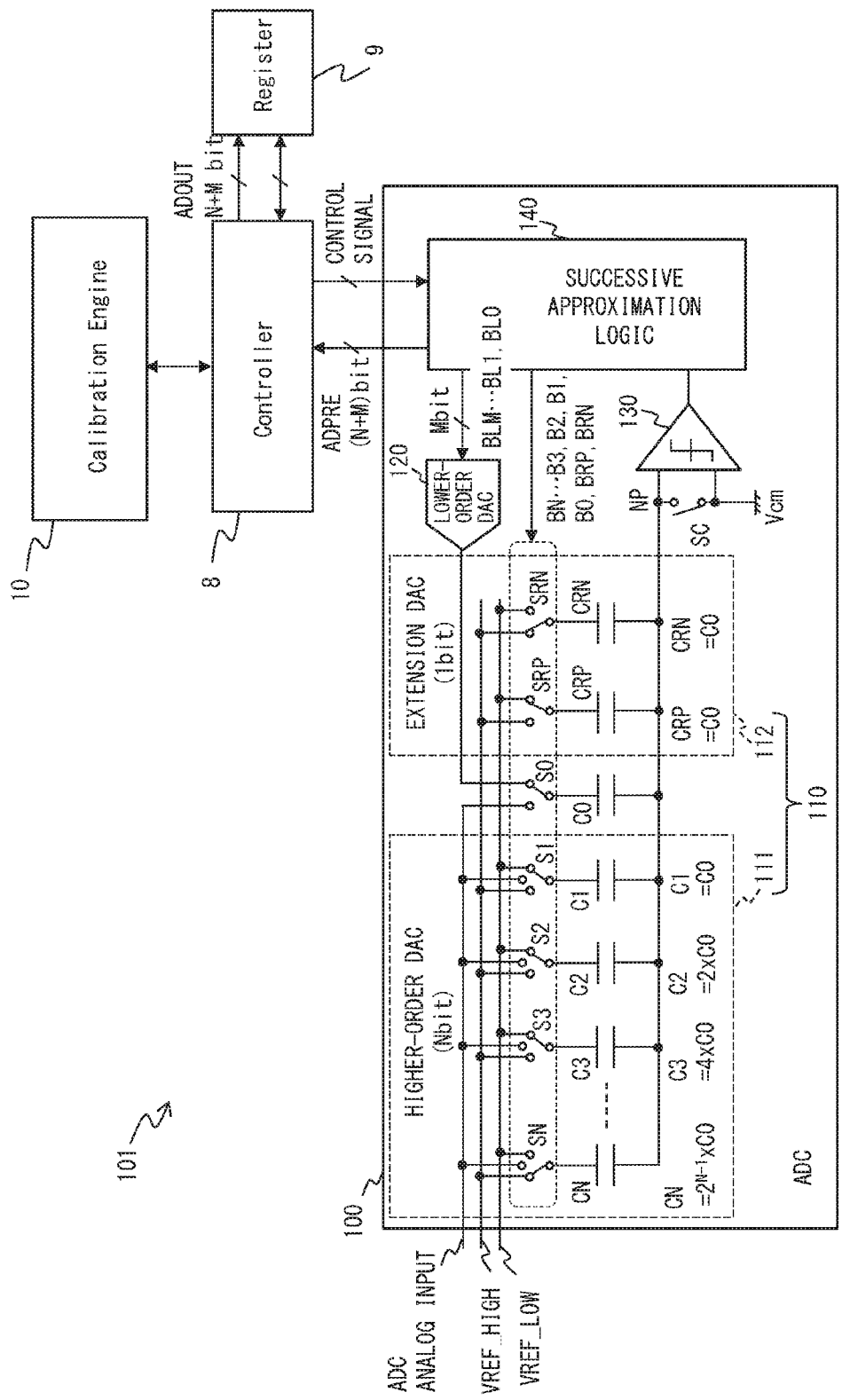
FIG. 5 is a diagram for explaining an operation of the ADC according to the first embodiment.

Subsequently, when the sampling is finished, the ADC 100 performs a successive approximation operation. FIG. 5 shows a state of the ADC when the successive approximation operation is started. As shown in FIG. 5, when the sampling is finished, the switch SC is turned off and the node NP is disconnected from the comparison reference voltage Vcm. The ADC 100 shifts to the successive approximation state, and the successive approximation logic 140 controls the successive approximation control signals BN . . . B0, BRP, and BRN to be set to an initial comparison code, and switches the switches SN . . . S0 according to the initial comparison code. For example, when an initial comparison voltage is started from (VREF_HIGH-VREF_LOW)/2, as shown in FIG. 5, the switch SN selects the reference voltage VREF_HIGH and the other switches SN-1 . . . S0 select the reference voltage VREF_LOW. At this time, the switches SRP and SRN are maintained in the same state as that during sampling.

The successive approximation logic 140 sequentially controls the successive approximation control signals BN . . . B0 so that the voltage at the node NP matches the comparison reference voltage Vcm, and the comparator 130 performs the comparison N times. After the comparison is performed N times, when the comparison result (the voltage at the node NP<the comparison reference voltage Vcm) of the comparator 130 is detected, the successive approximation control signal BRP is switched and the voltage to be selected by the switch SRP is shifted from VREF_LOW to VREF_HIGH. When the comparison result (the voltage at the node NP>the comparison reference voltage Vcm) of the comparator 130 is detected, the successive approximation control signal B1 is switched so that the switch S1 of the capacitor element C1 is switched to shift the voltage to be selected by the switch S1 from VREF_HIGH to VREF_LOW, and then the comparison is performed again. The conversion in this comparison operation is a redundant conversion.

After the successive approximation performed by the higher-order DAC 111, the lower-order DAC 120 connected to the capacitor element C0 performs successive approximation. At this time, when the code (successive approximation result) is shifted to the negative side, the successive approximation control signal BRN is switched to shift the voltage to be selected by the switch SRN, which is connected to the capacitor element CRN, from VREF_HIGH to VREF_LOW, and the output of the lower-order DAC 120 is set to the value of (VREF_HIGH-VREF_LOW)/2 according to the successive approximation control signals BLM . . . BL0. The successive approximation logic 140 sequentially controls the successive approximation control signals BLM . . . BL0, and the comparator 130 performs the comparison M times. When the comparison is performed M times using the lower-order DAC 120, the (N+M)-bit AD conversion result ADPRE before correction is obtained.

The conversion result of the redundant successive approximation can be expressed as follows. When the bits of the successive approximation control signals BN . . . B1 indicate 1, the reference voltage VREF_HIGH is selected. When the bits of the successive approximation control signals BN . . . B1 indicate 0, the reference voltage VREF_LOW is selected. The bits of the successive approximation control signals BRP and BRN indicate 1 when the state is shifted (switched) during comparison, and the bits of the successive approximation control signals BRP and BRN indicate 0 when the sampling state is held. At this time, the successive approximation conversion result ADPRE of the ADC 100 before correction is expressed by the following formula (1).

$$ADPRE = 2^{(N-1+M)} * BN + 2^{(N-2+M)} * B(N-1) + \ldots + 2^{(1+M)} * B2 + \qquad (1)$$
$$2^M * B1 + 2^M * BRP - 2^M BRN + 2^{(M-1)} * BLM + \ldots + 2^0 * BL1$$

By the formula (1), multiplications for the operation to derive the code (successive approximation result) can be substituted by bit shift. Accordingly, the successive approximation logic for performing the operation can be configured using only an adder/subtractor. Consequently, a simple circuit configuration can be achieved.

<Characteristics of Extension DAC>

As one of the features of the first embodiment, the extension DAC having positive and negative polarities will be described below.

Figure 6A:
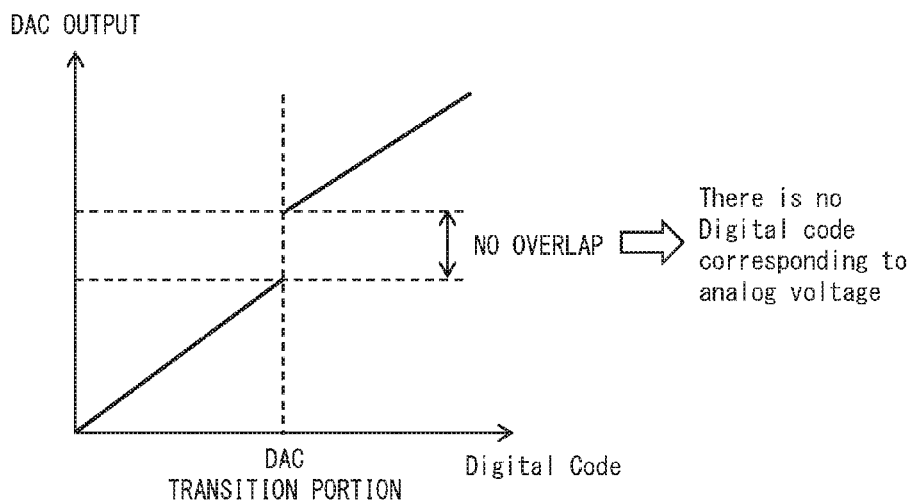
FIG. 6A is a characteristic diagram showing characteristics of a DAC within an ADC of a reference example.

A configuration in which the extension DAC as illustrated in the first embodiment is not provided will now be considered as a reference example. FIG. 6A shows the characteristics of the DAC of the reference example. Specifically, as shown in FIG. 6A, when the extension DAC is not provided, the output of the DAC may be discontinuous due to a mismatch between analog elements. When the output of the DAC is discontinuous at a portion in which the digital code of the DAC is shifted, that is, when there is no digital code corresponding to an analog voltage, the analog voltage cannot be represented by a digital code. Therefore, the digital code cannot be corrected.

Figure 6B:
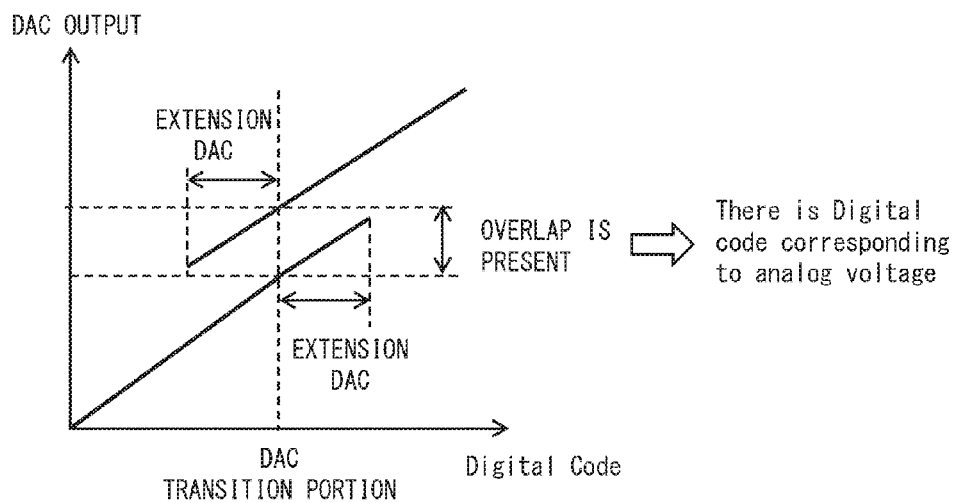
FIG. 6B is a characteristic diagram showing characteristics of a DAC within the ADC according to the first embodiment.

On the other hand, when the extension DAC is introduced like in the first embodiment, the DAC of the first embodiment has characteristics as shown in FIG. 6B. Specifically, since the extension DAC has positive and negative polarities, discontinuous portions of the output of the DAC are redundant and overlap as shown in FIG. 6B. Therefore, the analog output of the DAC can be represented by a digital code.

Further, when the redundant conversion by the extension DAC is considered, a configuration using only one extension DAC that operates in the positive polarity can be employed. In this case, however, the following problem arises.

Figure 7A:
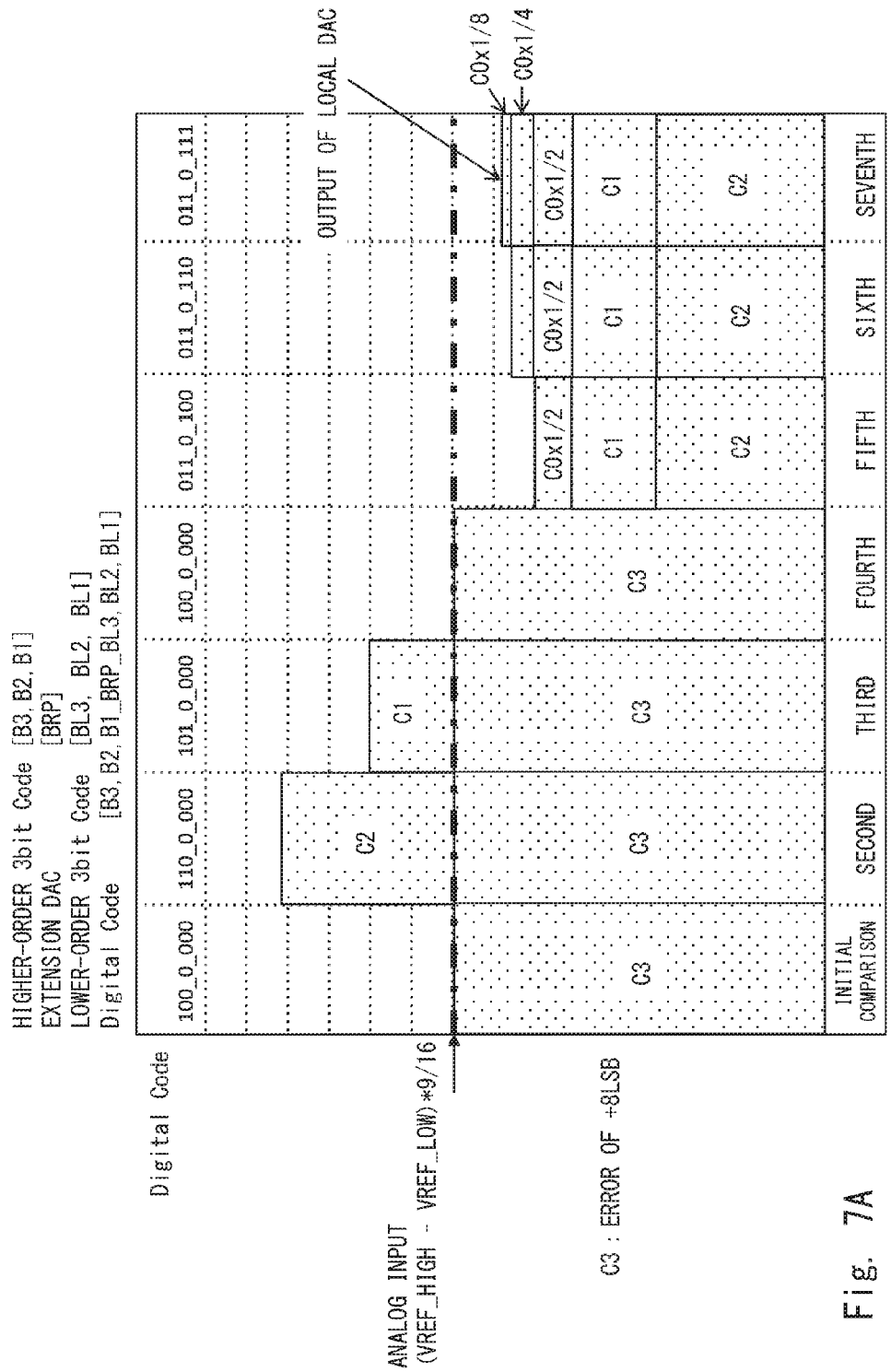
FIG. 7A is a diagram showing a successive approximation operation of the ADC of the reference example.
Figure 7B:
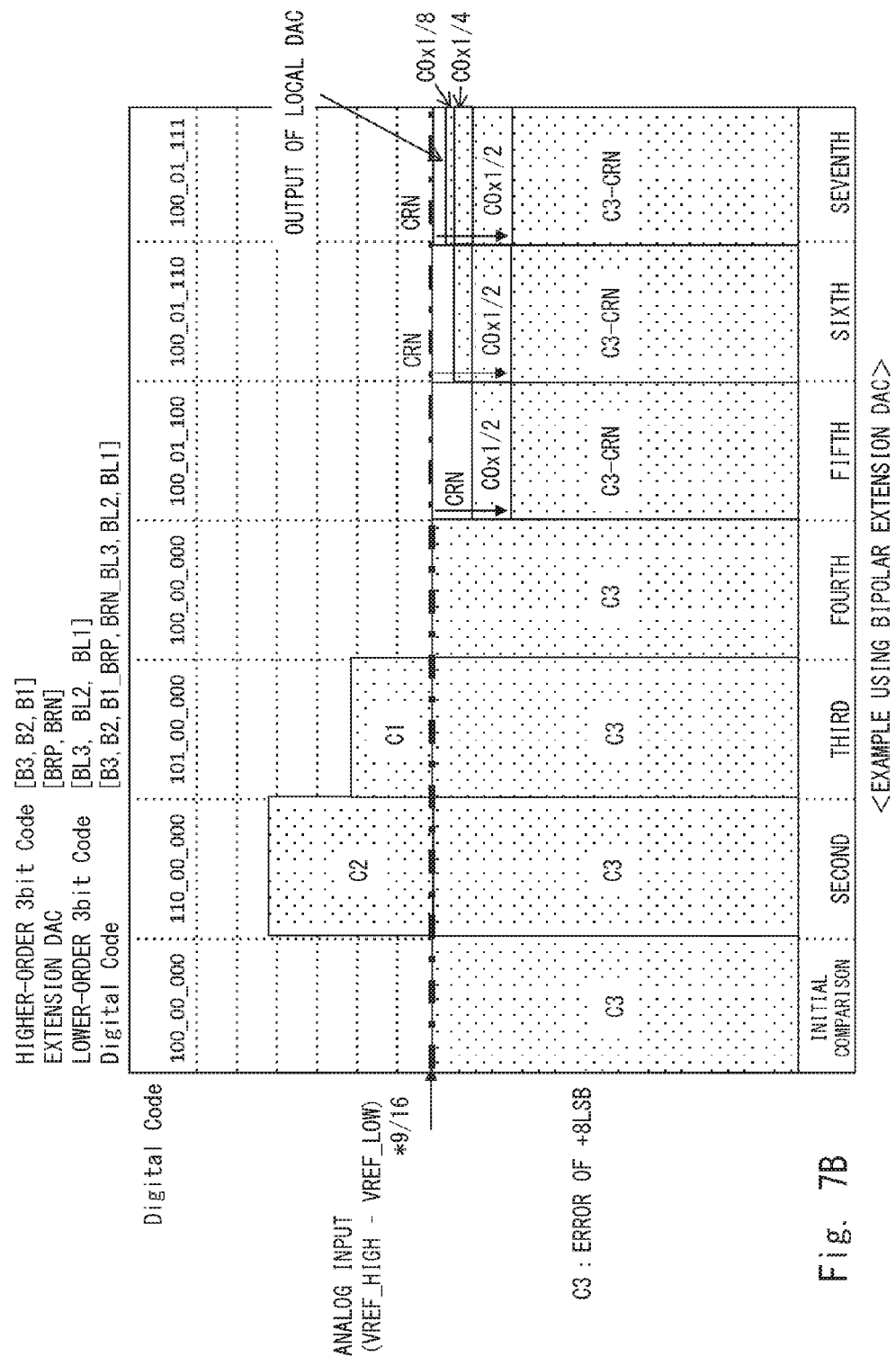
FIG. 7B is a diagram showing a successive approximation operation of the ADC according to the first embodiment.

For example, the transition of a high-order 3-bit (N=3) ADC digital code and a lower-order 3-bit (M=3) ADC digital code is considered. FIG. 7A shows the case of the reference example in which the capacitor element CRP having a positive polarity is used as the extension DAC. FIG. 7B shows the case of the first embodiment in which two pairs of the capacitor elements CRP and CRN each having positive and negative polarities are provided. The case shown in FIG. 7A and the case shown in FIG. 7B are compared.

In the reference example shown in FIG. 7A, the capacitance C3 of the local DAC has an error of +8LSB, and an analog input signal represented by (VREF_HIGH-VREF_LOW)*9/16 is input. In the reference example, only the capacitor element CRP is used as the extension DAC, and only BRP is used as the code (successive approximation control signal) of the extension DAC, and thus a digital code=(B3, B2, B1_BRP_BL3, BL2, BL1) is used. Capacitances selected according to the code are successively compared with the analog input signal.

As shown in FIG. 7A, in an initial comparison, the analog input signal is compared with the capacitance C3 according to a digital code=100_0_000. In this comparison, it is determined that the analog input signal is greater than the capacitance C3. Accordingly, in a second comparison, the analog input signal is compared with the capacitance C2+C3 according to a digital code=110_0_000. In a third comparison, the analog input signal is compared with the capacitance C1+C3 according to a digital code=101_0_000. In a fourth comparison, the analog input is compared with the capacitance C3 according to a digital code=100_0_000.

The bit B3 that is the MSB of the digital code changes due to a transition from the fourth comparison, which is a redundant comparison, to a fifth comparison. Specifically, in the fifth comparison, the analog input signal is compared with the capacitance C1+C2+C0/2 according to a digital code=011_0_100. In this comparison, it is determined that the analog input signal is greater than the capacitance. Accordingly, in a sixth comparison, the analog input signal is compared with the capacitance C1+C2+C0/2+C0/4 according to a digital code=011_0_110. In a seventh comparison, the analog input signal is compared with the capacitance C1+C2+C0/2+C0/4+C0/8 according to a digital code=011_0_111.

Since the error of C3−(C2+C1+C0)=8LSB is considered in the reference example, the error at this time cannot be recovered by the fifth to seventh conversions. Thus, it is obvious that the value of the local DAC in the final conversion still has an error of 1.5 LSB.

Next, the example shown in FIG. 7B in which the extension DAC having a negative polarity is introduced like in the first embodiment is considered. Also in the example shown in FIG. 7B, the local DAC has an error like in the example shown in FIG. 7A, and the same analog input signal as that shown in FIG. 7A is input. In the first embodiment, the capacitor elements CRP and CRN are used as the extension DAC, and BRP and BRN are used as the code (successive approximation control signal) of the extension DAC, and thus a digital code=(B3, B2, B1_BRP, BRN_BL3, BL2, BL1) is used. Capacitances selected according to the code are successively compared with the analog input signal. The initial comparison and the second to fourth comparisons are similar to those shown in FIG. 7A.

As shown in FIG. 7B, in the fifth comparison, the analog input signal is compared with the capacitance (C3−CRN)+C0/2 according to a digital code=100_01_100. In the sixth comparison, the analog input signal is compared with the capacitance (C3−CRN)+C0/2+C0/4 according to a digital code=100_01_110. In the seventh comparison, the analog input signal is compared with the capacitance (C3−CRN)+C0/2+C0/4+C0/8 according to a digital code=100_01_111.

Thus, in the first embodiment, in a transition from the fourth comparison, which is a redundant comparison, to the fifth comparison, the capacitor element CRN of the negative-side extension DAC operates to thereby enable the transition of the comparison without changing the bit B3. Therefore, the output value of the local DAC in the final comparison is shifted within a range of a difference of 0.5 LSB from the analog input signal, and thus the correct conversion result can be obtained. On the basis of the above considerations, in the first embodiment, the positive and negative polarities are introduced in the extension DAC, which makes it possible to recover an error in the higher-order DAC and to achieve the transition of the local DAC which is capable of performing digital correction.

<Error Correction Operation After AD Conversion>

Next, an error correction operation for an AD conversion result in the controller according to the first embodiment will be described. Assuming that an error of a capacitance of a capacitor element based on a capacitance of a reference capacitor element is represented by $\epsilon$, errors in the respective capacitor elements are expressed by the following formulas.

$$\epsilon(N) = CNi - CN \qquad (2.1)$$

$$\epsilon(N-1) = C(N-1)i - C(N-1) \qquad (2.2)$$

$$\epsilon 2 = C2i - C2 \qquad (2.3)$$

$$\epsilon 1 = C1i - C1 \qquad (2.4)$$

$$\epsilon 0 = C0i - C0 \quad (2.5)$$

$$\epsilon RP = CRPi - CRP \quad (2.6)$$

$$\epsilon RN = CRNi - CRN \quad (2.7)$$

In these formulas, CNi, C (N−1)i . . . C2i, C1i, C0i, CRPi, and CRNi represent ideal capacitance values. Examples of criteria for the ideal capacitance values may include an ideal value assumed from a total (full-scale) capacitance value which contributes to sampling, and a difference between a capacitance value and a reference capacitance value for correction. In the first embodiment, the correction can be performed based on these two criteria, and the details thereof will be described later.

Figure 8:
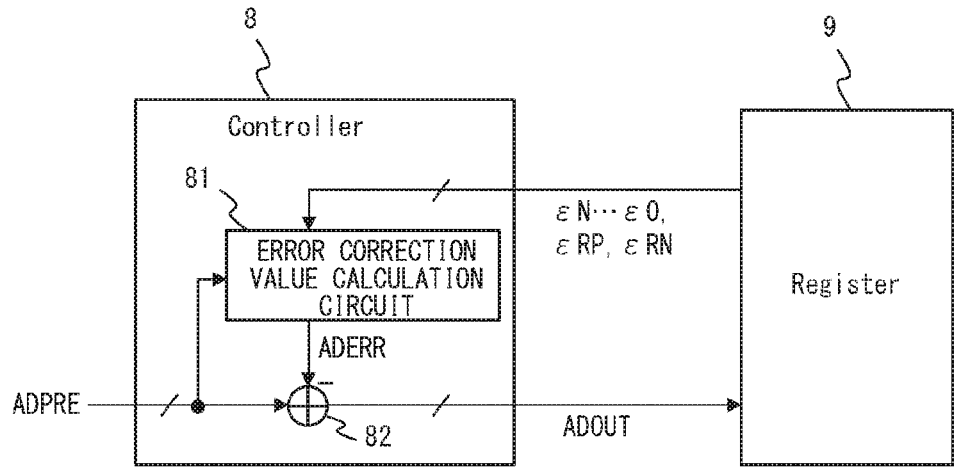
FIG. 8 is a block diagram showing a configuration example of a controller according to the first embodiment.

FIG. 8 shows a flow of a signal representing an AD conversion result in a configuration example of the controller according to the first embodiment. The controller 8 reads the values of errors $\epsilon$ ($\epsilon N$ . . . $\epsilon 0$, $\epsilon RP$, and $\epsilon RN$) of the respective capacitances stored in the register 9, and subtracts the value of the error $\epsilon$ corresponding to the code (ADPRE) from the AD conversion result ADPRE before correction, thereby obtaining a corrected AD conversion result ADOUT. As shown in FIG. 8, the controller 8 includes an error correction value calculation circuit 81 that calculates an error value, and a subtractor 82 that subtracts the error value from the AD conversion result.

The corrected AD conversion result ADOUT can be obtained as follows. In the following formula, the correction is not performed on the lower-order DAC. However, the correction may also be performed on the lower-order DAC.

First, the error correction value calculation circuit 81 reads the error $\epsilon$ from the register 9, and calculates an error correction value ADERR corresponding to the code by the following formula.

$$ADERR = \epsilon N^* BN + \epsilon(N-1)^* B(N-1) + \ldots + \epsilon 2^* B2 + \epsilon 1^* B1 + \epsilon RP^* BRP - \epsilon RN^* BRN + \epsilon 0^* (BLSB) \quad (3)$$

In the formula (3), BLSB represents a signal corresponding to the code of the lower-order DAC. The value of the signal BLSB varies depending on the correction method, and thus the detailed description thereof is omitted.

After that, the subtractor 82 subtracts the error correction value ADERR from the AD conversion result ADPRE before correction as shown in the following formula, thereby obtaining the corrected AD conversion result ADOUT. The subtractor 82 outputs the obtained corrected AD conversion result ADOUT to the register 9.

$$ADOUT = ADPRE - ADERR \quad (4)$$

<Error Calculation Method During Calibration>

Next, a method for calculating the error $\epsilon$ in the calibration engine according to the first embodiment will be described. The method for calculating the error $\epsilon$ is basically similar to that disclosed in Non Patent Literature 1. In the first embodiment, since the local DAC is composed of capacitances weighted by a power of two, the capacitances have the following relations.

$$CN = C(-1) + \ldots + C2 + C1 + C0 \quad (5.1)$$

$$C(N-1) = C(N-2) + \ldots + C2 + C1 + C0 \quad (5.2)$$

$$C3 = C2 + C1 + C0 \quad (5.3)$$

$$C2 = C1 + C0 \quad (5.4)$$

$$C1 = C0 \quad (5.5)$$

$$C0 = CRP \quad (5.6)$$

$$C0 = CRN \quad (5.7)$$

A difference between the capacitances is first obtained using the relations described above. A difference E between the capacitances can be expressed as follows.

$$EN = CN - \{C(N-1) + \ldots + C2 + C1 + C0\} \quad (6.1)$$

$$E(N-1) = C(C-1) - \{C(N-2) + \ldots + C2 + C1 + C0\} \quad (6.2)$$

$$E3 = C3 - \{C2 + C1 + C0\} \quad (6.3)$$

$$E2 = C2 - (C1 + C0\} \quad (6.4)$$

$$E1 = C1 - C0 \quad (6.5)$$

$$ERP = CRP - C0 \quad (6.6)$$

$$ERN = CRN - C0 \quad (6.7)$$

The above formulas can be modified in the following manner as errors with respect to the capacitance C0.

$$C2 - 2C0 = E1 + E2 \quad (7.1)$$

$$C3 - 4C0 = 2E1 + E2 + E3 \quad (7.2)$$

$$C4 - 8C0 = 4E1 + 2E2 + E3 + E4 \quad (7.3)$$

$$CN - 2^{(N-1)} * C0 = \\ 2^{(N-2)}E1 + 2^{(N-3)}E2 + 2^{(N-4)}E3 + \ldots + 2^{(N-(N-1))}E(N-2) + \\ 2^{(N-N)}E(N-1) + EN = 2^{(N-2)}E1 + 2^{(N-3)}E2 + \\ 2^{(N-4)}E3 + \ldots + 2E(N-2) + E(N-1) + EN \quad (7.4)$$

Next, two methods for obtaining the error $\epsilon$ using the above formulas will be described.

(Method 1) The Error $\epsilon$ is Obtained Based on the Capacitance C0.

This method is based on the capacitance C0 and obtains the error $\epsilon$ from the difference between a capacitance and the capacitance C0. In this case, the error $\epsilon$ can be simply obtained by the above formulas (7.1) to (7.4). Accordingly, the error $\epsilon$ based on the capacitance C0 can be obtained by the following formulas.

$$\epsilon 1 = C0 - C1 = -E1 \quad (8.1)$$

$$\epsilon 2 = 2C0 - C2 = -(E1 + E2) \quad (8.2)$$

$$\epsilon 3 = 4C0 - C3 = -(2E1 + E2 + E3) \quad (8.3)$$

$$\epsilon 4 = 8C0 - C4 = -(4E1 + 2E2 + E3 + E4) \quad (8.4)$$

$$\epsilon N = 2^{(N-1)} * C0 - CN = -(2^{(N-2)}E1 + 2^{(N-3)}E2 + 2^{(N-4)}E3 + \ldots + 2E(N-2) + E(N-1) + EN) \quad (8.5)$$

$$\epsilon RP = C0 - CRP = -ERP \quad (8.6)$$

$$\epsilon RN = C0 - CRN = -ERN \quad (8.7)$$

The calibration engine 10 obtains the error $\epsilon$ based on the formulas (8.1) to (8.7) and stores the obtained error in the register 9. After that, the controller 8 corrects the AD conversion result ADPRE using the error $\epsilon$ as described above with reference to FIG. 8. In this case, the controller 8 modifies the formula (3) as follows and performs the correction. Since this method is based on the capacitance C0, the term $\epsilon 0$ in the formula (3) is 0.

$$ADERR = \epsilon N^* BN + \epsilon(N-1)^* B(N-1) + \ldots + \epsilon 2^* B2 + \epsilon 1^* B1 + \epsilon RP^* BRP - \epsilon RN^* BRN \quad (9)$$

Figure 9:
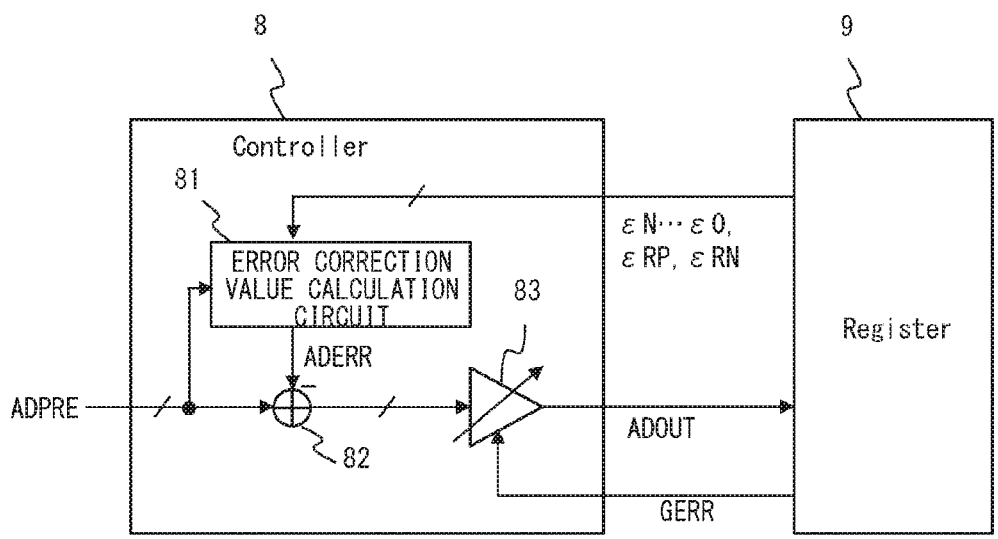
FIG. 9 is a block diagram showing another configuration example of the controller according to the first embodiment.

This method has a problem that, since the error $\epsilon$ is obtained based on the capacitance C0, the error value of the capacitance CN is increased to about $2^{N-1}$. In other words, such a large error appears as a gain error in the corrected AD conversion result ADOUT. In order to avoid this problem, the controller 8 needs to be additionally provided with a gain correction circuit 83 that corrects the gain of the corrected conversion result as shown in FIG. 9. The gain correction circuit 83 corrects the AD conversion result according to the gain error obtained from the register 9, and outputs the corrected AD conversion result ADOUT. Assuming herein that the gain error is represented by GERR, the corrected AD conversion result ABOUT is obtained as follows.

$$ADOUT=(1/GERR)(ADPRE-ADERR) \quad (10)$$

(Method 2) The Error $\epsilon$ is Pbtained Based on a Full-Scale Capacitance.

As described above, when the error $\epsilon$ is obtained based on the capacitance C0, the circuit for gain correction is required. The calculation method which eliminates the need for gain correction by obtaining the error $\epsilon$ in advance based on the full-scale capacitance (of all capacitor elements) will now be described. Assuming that the entire capacitance value that contributes to sampling is represented by Ctot, Ctot is expressed by the following formula and the error $\epsilon$ is obtained based on the capacitance value Ctot.

$$Ctot=CN+C(N-1)+\ldots+C3+C1+C0 \quad (11)$$

The capacitance Ctot can be obtained based on the capacitance C0 by modifying the formulas (6.1) to (6.7) and the formulas (7.1) to (7.4) as follows.

$$Ctot=2^{N*}C0+2^{(N-1)}E1+2^{(N-2)}E2+2^{(N-3)}$$
$$E3+\ldots+2^{(N-(N-2))}E(N-2)+2^{(N-(N-1))}$$
$$E(N-1)+EN=2^{N*}C0+2^{(N-1)}E1+2^{(N-2)}$$
$$E2+2^{(N-3)}E3+\ldots+4E(N-2)+2E(N-1)+EN \quad (12)$$

On the basis of this formula, the error $\epsilon$ based on the capacitance Ctot can be obtained by the following formulas.

$$\epsilon 0=Ctot/2^N-C0 \quad (13.1)$$

$$\epsilon 1=Ctot/2^N-C1=Ctot/2^N-(C0+E1) \quad (13.2)$$

$$\epsilon RP=Ctot/2^N-CRP \quad (13.3)$$

$$\epsilon RN=Ctot/2^N-CRN \quad (13.4)$$

$$\epsilon 2=Ctot/2^{(N-1)}-C2 \quad (13.5)$$

$$\epsilon 3=Ctot/2^{(N-2)}-C3 \quad (13.6)$$

$$\epsilon(N-1)=Ctot/2^2-C(N-1) \quad (13.7)$$

$$\epsilon N=Ctot/2-CN \quad (13.8)$$

When these formulas are calculated, the term C0 included in each of the formulas (12) and (13.1) to (13.8) vanishes, and all the errors $\epsilon$ can be represented by E.

The calibration engine 10 obtains the error $\epsilon$ by the formula (13) and stores the obtained error $\epsilon$ in the register 9. After that, the controller 8 corrects the AD conversion result without performing the gain correction using the error $\epsilon$ in the configuration shown in FIG. 8. In this case, since there is no need to change the formula (3), the controller 8 performs the correction using the formula (3) as it is. At this time, BLSB in the formula (3) is expressed as follows according to the code of the lower-order DAC.

$$BLSB=\{2^{(M-1)*}BLM+2^{(M-2)*}BL$$
$$(M-1)+\ldots+2^{0*}BL1\}/2^M \quad (14)$$

In the case of obtaining the error $\epsilon$ in the ADC according to the first embodiment, the values of the formulas (6.1) to (6.7) are obtained based on the lower-order DAC to thereby obtain the values of the formulas (13.1) to (13.8). At this time, when $\epsilon 0$ is large, the effect of the gain error caused by $\epsilon 0$ still exists in the values obtained by the formulas (13.1) to (13.8). To more accurately obtain the values, it is necessary to correct the error. A coefficient GCAL for correcting the gain error at this time can be obtained as follows.

$$GCAL=(2^M-\epsilon 0)/2^M \quad (15)$$

Accordingly, true error values can be obtained by multiplying the coefficient GCAL by the formulas (13.1) to (13.8) as shown in the following formulas.

$$\epsilon 0=GCAL\{Ctot/2^N-C0\} \quad (16.1)$$

$$\epsilon 1=GCAL\{Ctot/2^N-C1\} \quad (16.2)$$

$$\epsilon RP=GCAL\{Ctot/2^N-CRP\} \quad (16.3)$$

$$\epsilon RN=GCAL\{Ctot/2^N-CRN\} \quad (16.4)$$

$$\epsilon 2=GCAL\{Ctot/2^{(N-1)}-C2\} \quad (16.5)$$

$$\epsilon 3=GCAL\{Ctot/2^{(N-2)}-C3\} \quad (16.6)$$

$$\epsilon(N-1)=GCAL\{Ctot/2^2-C(N-1)\} \quad (16.7)$$

$$\epsilon N=GCAL\{Ctot/2-CN\} \quad (16.8)$$

In this case, the use of $\epsilon 0$ to obtain the coefficient GCAL causes a contradiction in the calculation of the formula (16.1). This contradiction can be solved by the following steps. That is, $\epsilon 0$ in the formula (15) is first calculated using the value of the formula (13.1) including the error, and the coefficient GCAL is calculated by the formula (15). Then, $\epsilon 0$ is obtained by the formula (16.1), and the obtained value of $\epsilon 0$ is input into the formula (15) again, to thereby update the value of the coefficient GCAL. Further, the operation of calculating the formula (16.1) and updating the value of $\epsilon 0$ is repeated a plurality of times, and thus $\epsilon 0$ is obtained recursively.

The error correction is performed to eliminate the gain error by correcting the error $\epsilon$ that is obtained based on the full-scale capacitance. This eliminates the need for gain correction after the correction.

<Operation of ADC During Calibration>

Next, the operation of the ADC 100 during the calculation of the error $\epsilon$ will be described. The operation of the DAC in the ADC 100 during the derivation of the error is basically similar to that disclosed in Non Patent Literature 1. In the derivation of the correction coefficient, the ADC 100 (or the calibration engine) obtains only the values of the formulas (6.1) to (6.7). The derivation of the correction coefficient for the capacitance CN will now be described by way of example.

Figure 10A:
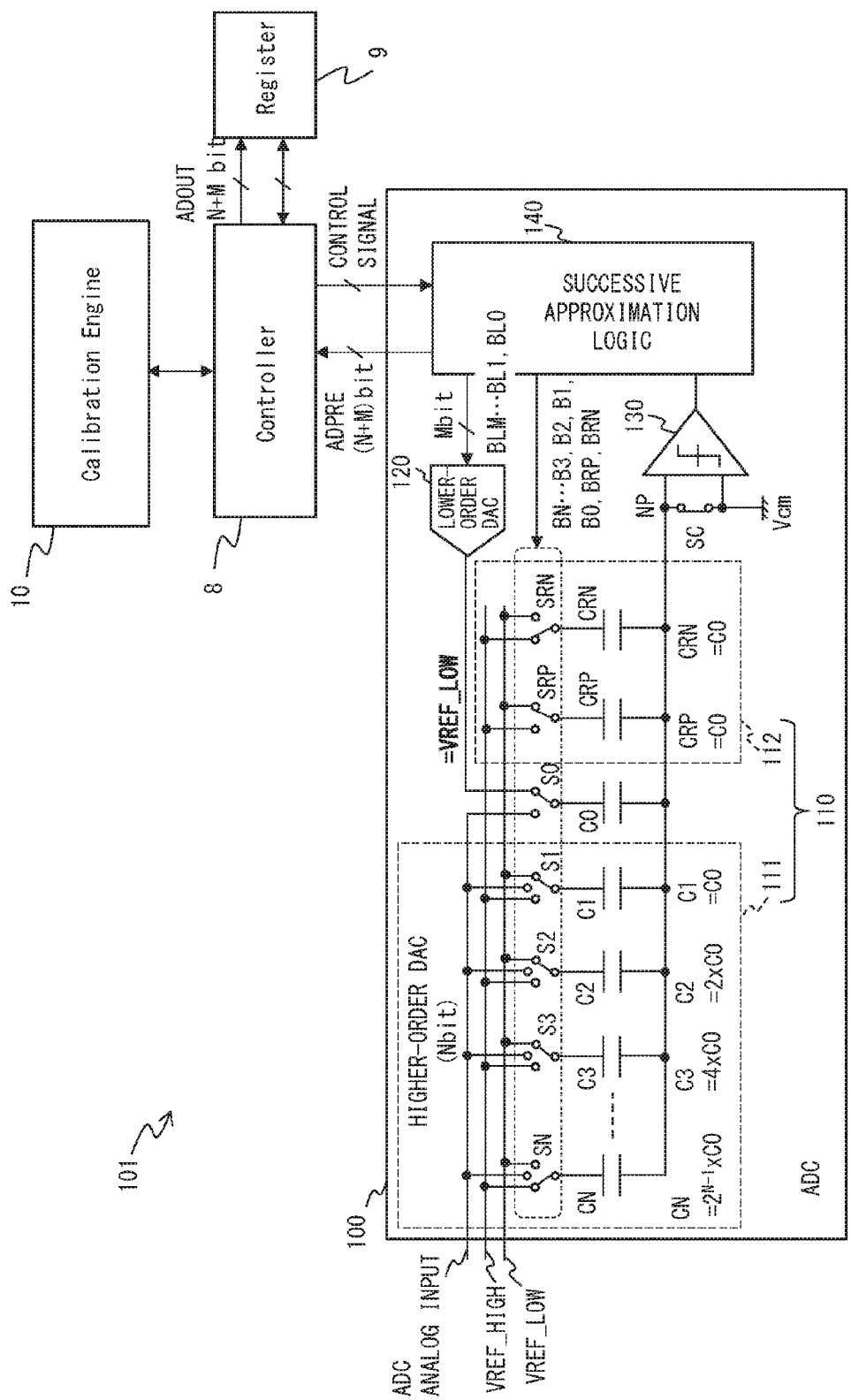
FIG. 10A is a diagram showing a calibration operation of the ADC according to the first embodiment.

FIG. 10A shows the sampling state of the ADC 100 during the derivation of an error. As shown in FIG. 10A, only the error derivation target capacitor element (the capacitor element for which an error is derived) CN is connected to VREF_HIGH, and the other capacitor elements are connected to VREF_LOW. The lower-order DAC 120 connected to the capacitor element C0 is also set to the code for outputting VREF_LOW. An amount of charge $Q_{smp}$ which is sampled at this time is expressed as follows.

$$Q_{smp}=CN(Vcm-VREF\_HIGH)+(C(N-1)+\ldots+C2+$$
$$C1+C0)(Vcm-VREF\_LOW) \quad (17)$$

Figure 10B:
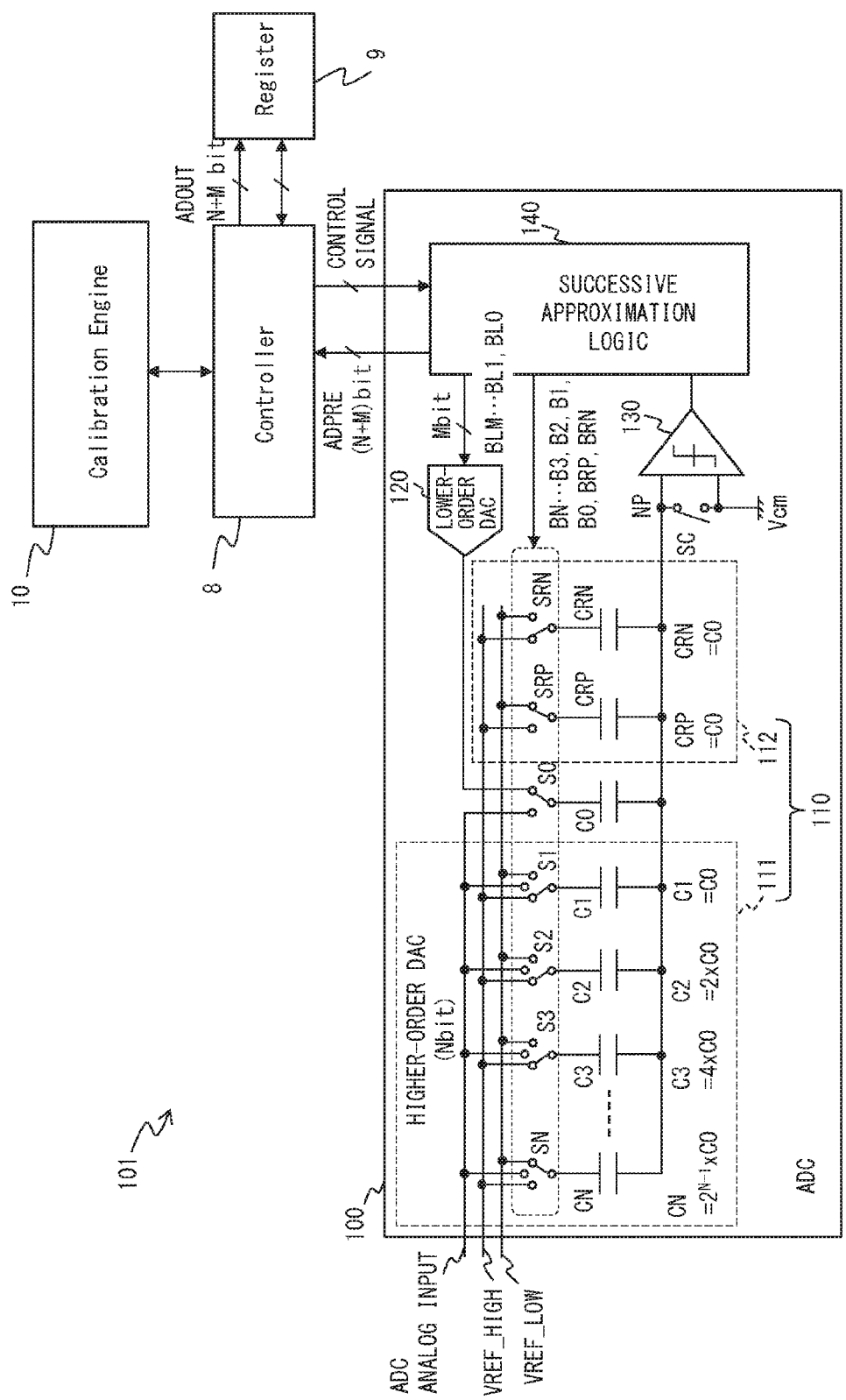
FIG. 10B is a diagram showing a calibration operation of the ADC according to the first embodiment.

Next, in a transition to the successive approximation, the initial comparison code is shifted as shown in FIG. 10B. The lower-order DAC 120 connected to the capacitor element C0 is first set to the code for outputting VREF_HIGH. A charge $Q_{conv\_1}$ in the initial comparison at this time is expressed as follows, assuming that the voltage at the node NP is represented by VNP.

$$Q_{conv\_1}=CN(VNP-VREF\_LOW)-(C(N-1)+\ldots+C2+C1+C0)(VNP-VREF\_HIGH) \quad (18)$$

In this case, when the error EN represented by the formula (6.1) is zero, i.e., when there is no error, the relation of Vcm=VNP holds, and the charge during sampling and the charge during comparison have the relation of $Q_{smp}=Q_{conv\_1}$.

In practice, however, since the EN error is not zero (EN≠0), Vcm is not equal to VNP (Vcm≠VNP). At this time, the successive approximation logic is activated to allow the lower-order DAC to operate to search the code for Vcm=VNP by a binary search. The difference between the code searched at this time and the code used in the initial comparison corresponds to the error EN.

Thus, the errors EN . . . E1 which are respectively expressed by the formulas (6.1) to (6.7) can be obtained by controlling all the capacitances in the same manner, so that the error ϵ used in the correction can be obtained. The value of the error is calculated in such a manner that a value is acquired a plurality of times until the effects of noise and the like are removed and then averaging processing is performed.

An offset of the comparator 130 poses a problem in the error calculation. A method for canceling the offset will be described below. In the case of deriving the error of the capacitance CN, for example, assuming that an error obtained from the formulas (17) and (18) is represented by EN1 and a conversion error caused due to the offset of the comparator 130 is represented by Eos, the following formula is established.

$$EN1=EN+Eos \quad (19)$$

Figure 11A:
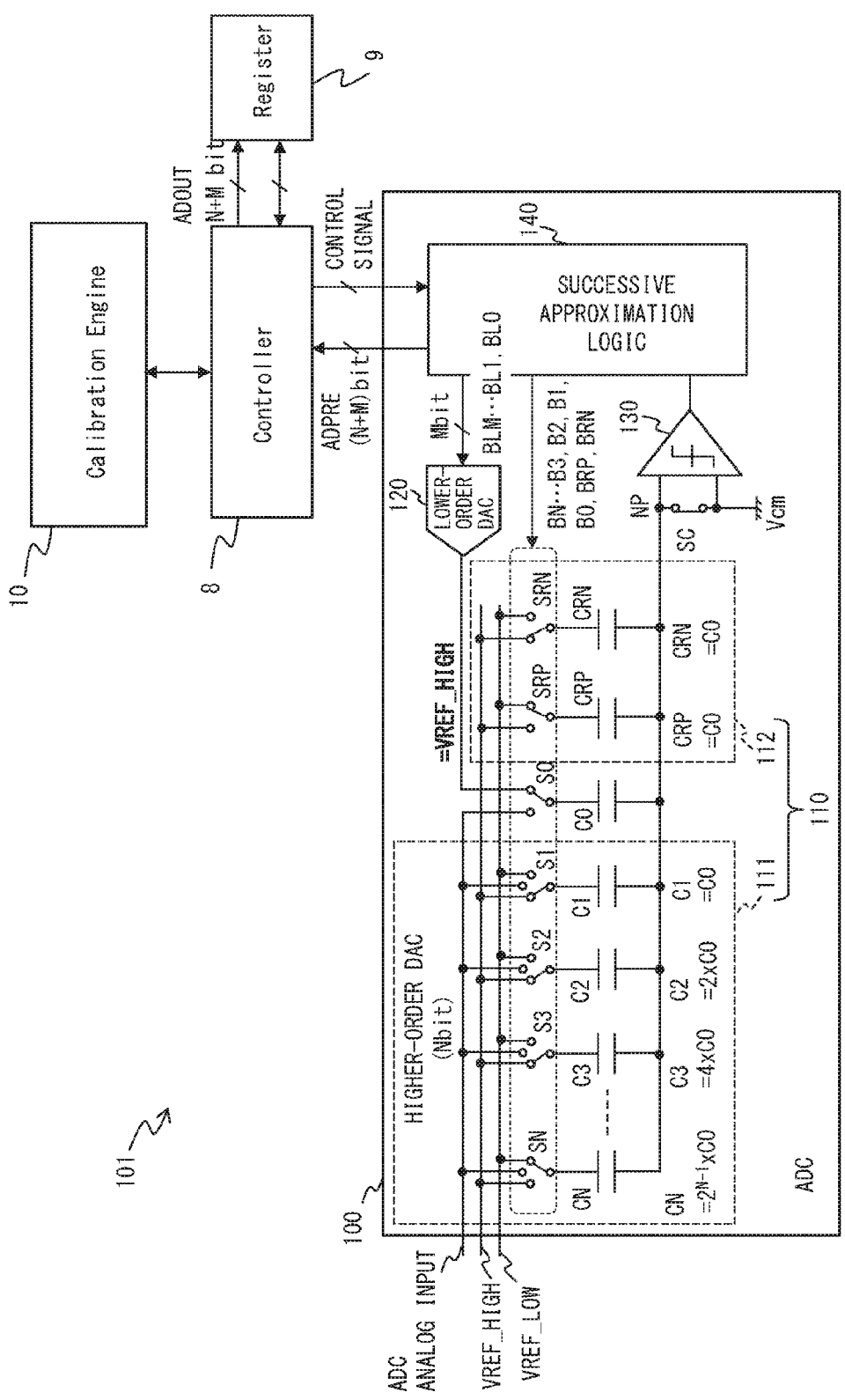
FIG. 11A is a diagram showing a calibration operation of the ADC according to the first embodiment.

Next, the voltage to be charged during sampling is replaced by the voltage to be charged during successive approximation. As shown in FIG. 11A, only the error derivation target capacitor element CN is connected to VREF_LOW, and the other capacitor elements are connected to VREF_HIGH. The lower-order DAC connected to the capacitor element C0 is also set to the code for outputting VREF_HIGH. An amount of charge $Q_{smp2}$ which is sampled at this time is expressed as follows.

$$Q_{smp2}=CN(Vcm-VREF\_LOW)+(C(N-1)+\ldots+C2+C1+C0)(Vcm-VREF\_HIGH) \quad (20)$$

Figure 11B:
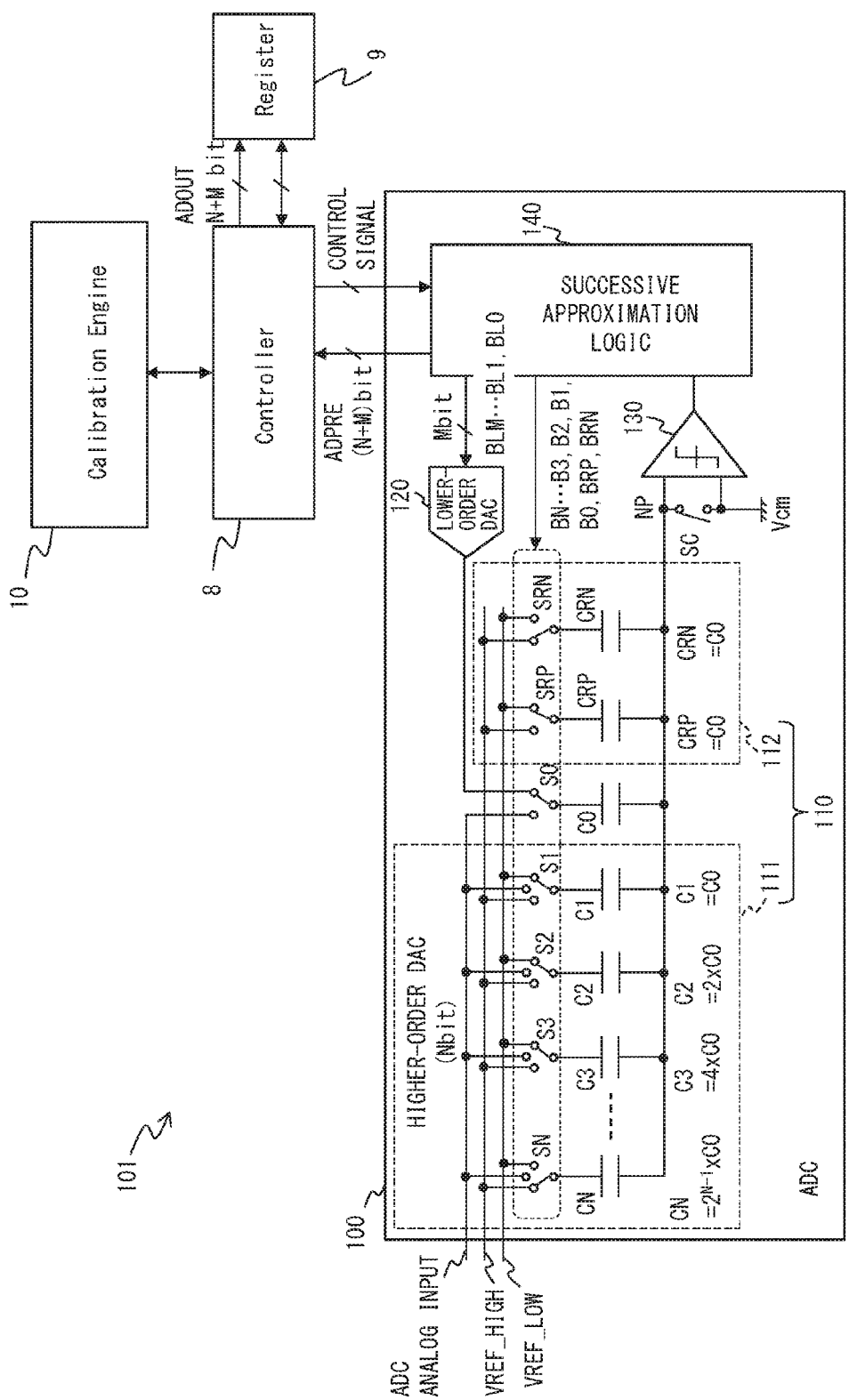
FIG. 11B is a diagram showing a calibration operation of the ADC according to the first embodiment.

Next, in a transition to the successive approximation, the initial comparison code is shifted as shown in FIG. 11B. The lower-order DAC 120 connected to the capacitor element C0 is first set to the code for outputting the VREF_LOW. A charge $Q_{conv\_2}$ during the initial comparison at this time is expressed as follows.

$$Q_{conv\_2}=CN(VNP-VREF\_HIGH)-(C(N-1)+\ldots+C2+C1+C0)(VNP-VREF\_LOW) \quad (21)$$

When the error value obtained at this time is represented by EN2, EN2 is obtained as a difference of the lower-order DAC with respect to VREF_LOW. Since the code is inverted, the polarity of the error EN is inverted. However, the polarity of the error caused due to the offset of the comparator 130 does not change. That is, the following formula is established.

$$EN2=-EN+Eos \quad (22)$$

Accordingly, the error value which is not affected by the offset of the comparator 130 can be obtained by subtracting the formula (21) from the formula (19).

$$EN1-EN2=2EN \quad (23)$$

While the conversion is repeatedly performed a plurality of times as described above, the error value can be obtained with high accuracy by replacing the code for an even number of conversions by the code for an odd number of conversions and performing the integration and averaging of the formula (23).

<Method for Carrying Out Correction Arithmetic Processing During Successive Approximation Operation for AD Conversion>

As described above, the correction processing after AD conversion is carried out after the conversion is finished. However, when the correction processing is simply performed after the AD conversion is finished, a correction time is added to an AD conversion time, which causes an overhead of processing time (processing speed). The formula (3) shows that the error ϵ, which is a correction coefficient, is data associated in one-to-one correspondence with the capacitances, i.e., the bits. Further, the successive approximation ADC determines the code in order from the most significant bit. The first embodiment is characterized in that a higher-level code does not change even when the redundant conversion is performed. Therefore, the correction processing can be carried out step by step in a FIFO (First In First Out) manner from the most significant bit, without waiting for the AD conversion of lower-order bits. Thus, the correction processing is completed during the successive approximation operation for AD conversion. This makes it possible to eliminate the overhead of AD conversion time due to the correction processing. In the arithmetic processing, for example, ADOUT and ADERR are subtracted and the resultant values are added in every conversion by an integration circuit, so that the final conversion result ADOUT is obtained.

Figure 12A:
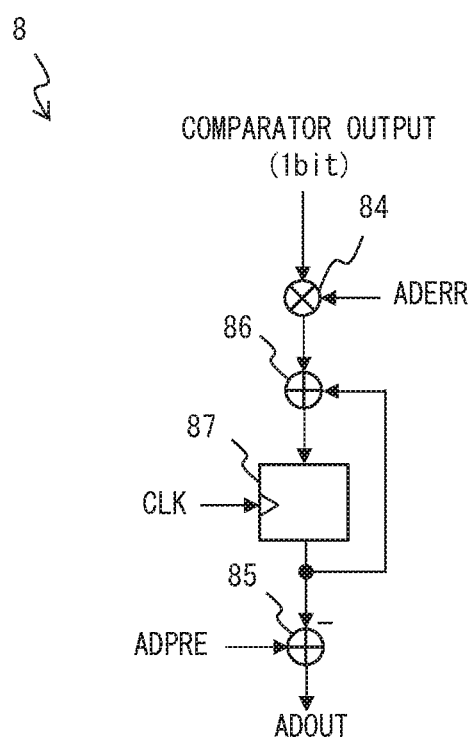
FIG. 12A is a block diagram showing a configuration example of the controller according to the first embodiment.
Figure 12B:
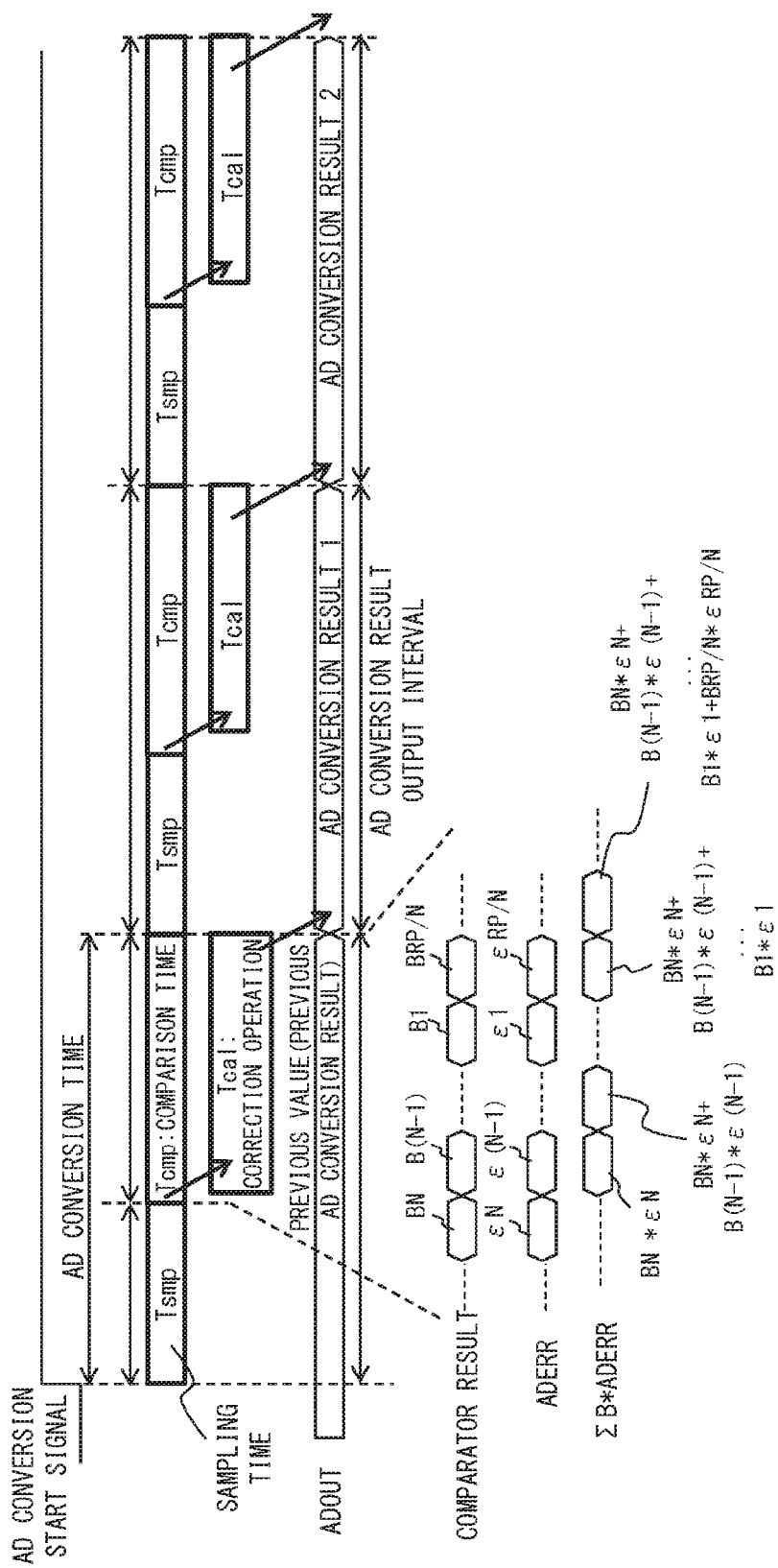
FIG. 12B is a diagram showing an AD conversion operation of the ADC according to the first embodiment.

FIG. 12A shows a configuration example of the controller 8 used in this case, and FIG. 12B shows an example of the operation thereof. As shown in FIG. 12A, the controller 8 includes a multiplier 84, a subtractor 85, an adder 86, and a latch circuit 87. The multiplier 84 multiplies the error correction value ADERR by the comparator result during the AD conversion before correction. The adder 86 integrates the output results from the latch circuit 87, and the latch circuit 87 outputs the addition result of the adder 86 according to a clock CLK. The subtractor 85 subtracts the output result of the latch circuit 87 from the AD conversion result ADPRE before correction. This output is the corrected AD conversion result ADOUT.

As shown in FIG. 12B, the ADC 100 repeatedly performs the AD conversion for the AD conversion time including a sampling time Tsmp and a comparison time (successive approximation time) Tcmp. When the successive approximation is started after sampling is finished, the ADC 100 sequentially outputs the comparison results in order from the most significant bit. With the configuration shown in FIG. 12B, the controller 8 multiplies the error correction value ADERR for each bit of the comparison results, and integrates the values for each comparison. After the comparison of the final bit, the comparison result is subtracted from the AD conversion result ADPRE before correction, and the AD conversion result ADOUT is output.

<Advantageous Effects of First Embodiment>

The first embodiment has an advantageous effect that it is possible to obtain a high-accuracy ADC with small elements by calculating a correction coefficient and correcting an error in the local DAC of the successive approximation ADC.

Since the correction in post processing can be carried out by providing the DAC with redundancy, the overhead in successive approximation processing can be eliminated. This leads to an improvement in comparison time. Further, the arithmetic processing based on a power-of-two weight makes it possible to reduce the computation scale. In particular, according to the first embodiment, the provision of the extension DAC having positive and negative polarities enables an improvement in accuracy and processing speed.

For example, when a typical non-binary weight of 1.85 is considered, a multiplier/divider is required every time arithmetic processing of $1.85^n$ is carried out. On the other hand, in the case of a binary weight, when $2^n$ is treated in the calculation, the processing can be performed by a simple bit shift and a correction logic can be configured using only an adder/subtractor, without using a multiplier/divider, which leads to a reduction in area and power consumption.

Second Embodiment

In a second embodiment, an example of the ADC using the lower-order DAC including a cascade coupling capacitance will be described. The basic configuration of the ADC is similar to that of the first embodiment, except for the lower-order DAC.

Figure 13:
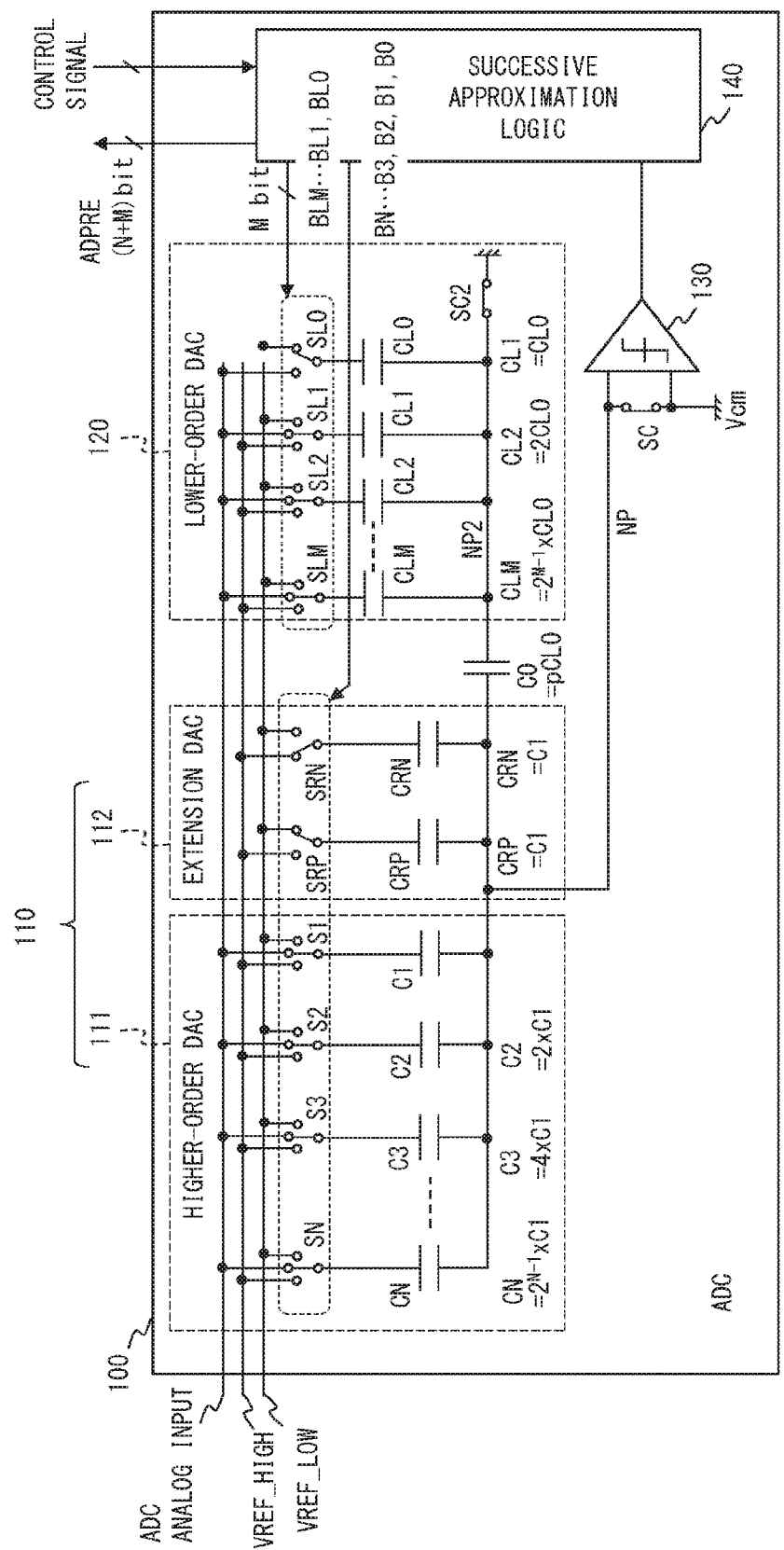
FIG. 13 is a block diagram showing a configuration example of an ADC according to a second embodiment.

FIG. 13 shows a configuration example of the ADC according to the second embodiment. As shown in FIG. 13, the ADC 100 according to the second embodiment includes the local DAC 110, the lower-order DAC 120, the comparator 130, and the successive approximation logic 140. The configuration of the lower-order DAC 120 is different from that of the first embodiment. The lower-order DAC 120 according to the second embodiment is configured using a capacitive DAC including capacitor elements CLM to CL0, and performs the successive approximation control for switches SLM to SL0 using the control signals BLM to BL0, respectively. The capacitor elements CLM to CL0 are each weighted by a power of two. The capacitance for connecting the lower-order DAC 120 and the local DAC 110 to each other is the cascade coupling capacitance C0. The lower-order DAC 120 having this configuration is called a DAC configuration using a cascade coupling capacitance.

The capacitor element C0 is connected to a common node between the capacitor elements CN to C1, CRP, and CRN. The capacitor elements CLM to CL0 are connected in parallel between the switches SLM to SL0 and the capacitor element C0. The switches SLM to SL0 are provided between the capacitor elements CLM to CL0 and each of the input terminal for the ADC analog input signal, the supply terminal for the reference voltage VREF_HIGH, and the supply terminal for the reference voltage VREF_LOW. A switch SC2 is provided between a reference voltage and a common node between the capacitor element C0 and the capacitor elements CLM to CL0. Further, in this example, a node between the capacitor element C1 and the capacitor element CRP is connected to one input terminal (node NP) of the comparator 130.

Assuming herein that a transfer function for obtaining the amount of charge transferred by switching of the capacitances of the capacitor elements CLM to CL1 through the capacitor element C0 is represented by $\gamma$, a charge transfer amount QCLM of the capacitor element CLM can be expressed as follows.

$$|QCLM|=\gamma CLM \times |VREF\_HIGH-VREF\_LOW|=\gamma 2CL0 \times |VREF\_HIGH-VREF\_LOW| \quad (24)$$

Assuming herein that an ideal transfer function $\gamma$ is represented by $\gamma_i$, $\gamma_i$ can be expressed as follows.

$$\gamma_i = \frac{pCL0}{pCL0 + CLM + \ldots + CL2 + CL1 + CL0} = \frac{p}{p + 2^M} \quad (25)$$

However, in the configuration shown in FIG. 13, in practice, a parasitic capacitance Cp is added to a node NP2 between the capacitor element CRP and the capacitor elements CLM . . . CL2, CL1, and CL0. When the parasitic capacitance is added, the transfer function $\gamma$ is modified as follows. Assume herein that the parasitic capacitance Cp has the following relation and $\gamma$ represents an arbitrary positive number.

$$Cp = \alpha CL0 \quad (26)$$

$$\gamma = \frac{p}{p + \alpha + 2^M} \quad (27)$$

Accordingly, since the transfer function $\gamma$ is affected by the parasitic capacitance, it is necessary to take into consideration $\alpha$ to obtain the correct transfer function. However, the parasitic capacitance is, for example, a wiring parasitic capacitance or a parasitic capacitance of a switch, and is a device different from each capacitor element of the DAC. This makes it difficult to obtain a ratio with high accuracy. For this reason, it has been difficult to configure a circuit using the cascade coupling capacitance which enables high-speed switching as the lower-order DAC constituting the ADC.

An error caused due to the parasitic capacitance of the lower-order DAC using the cascade coupling capacitance can be corrected by a digital correction method according to the second embodiment. In the case of the example shown in FIG. 13, the transfer function $\gamma$ to be transmitted to the node NP through the capacitor element CRP so as to provide redundancy is set as follows.

$$\gamma 2^M C0/C1 \geq 1 \quad (28)$$

When the transfer function $\gamma$ is equal to or greater than 1, the lower-order DAC 120 can transfer the amount of charge which is larger than the reference capacitance C1 of the higher-order DAC 111, which makes it possible to provide redundancy. Therefore, the DAC having the cascade coupling capacitance configuration eliminates discontinuous portions in the output of the DAC, so that the digital correction can be performed. In this case, it is obvious that the same advantageous effects can be obtained by performing the calibration operation on the capacitances in the same manner as in the first embodiment.

Figure 14:
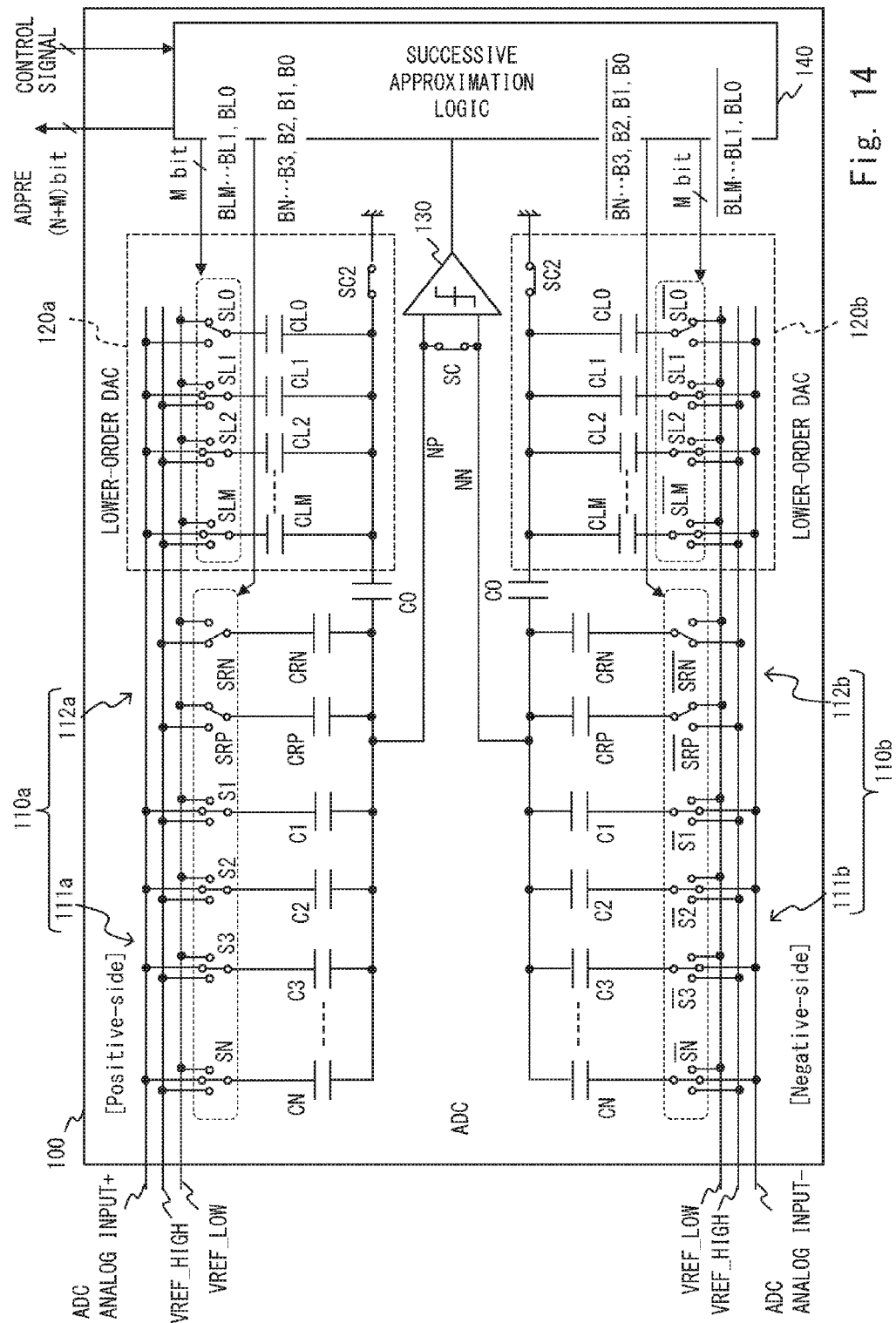
FIG. 14 is a block diagram showing another configuration example of the ADC according to the second embodiment.

Like in the first embodiment, the ADC shown in FIG. 13 may be implemented by a complete differential configuration as shown in FIG. 14. Like in the first embodiment shown in FIG. 4, the example shown in FIG. 14 includes the local DAC 110a, the lower-order DAC 120a, the local DAC 110b, the lower-order DAC 120b, the comparator 130, and the successive approximation logic 140, and the lower-order DAC 120a and the lower-order DAC 120b are coupled with the cascade coupling capacitance C0, like in the example shown in FIG. 13.

As described above, FIG. 13 shows a configuration using the lower-order DAC having the cascade coupling capacitance configuration. In this configuration, redundancy is provided as described above according to the formula (28). When attention is focused on the redundancy, the extension DAC can be incorporated in the configuration of the cascade coupling capacitance.

Figure 15:
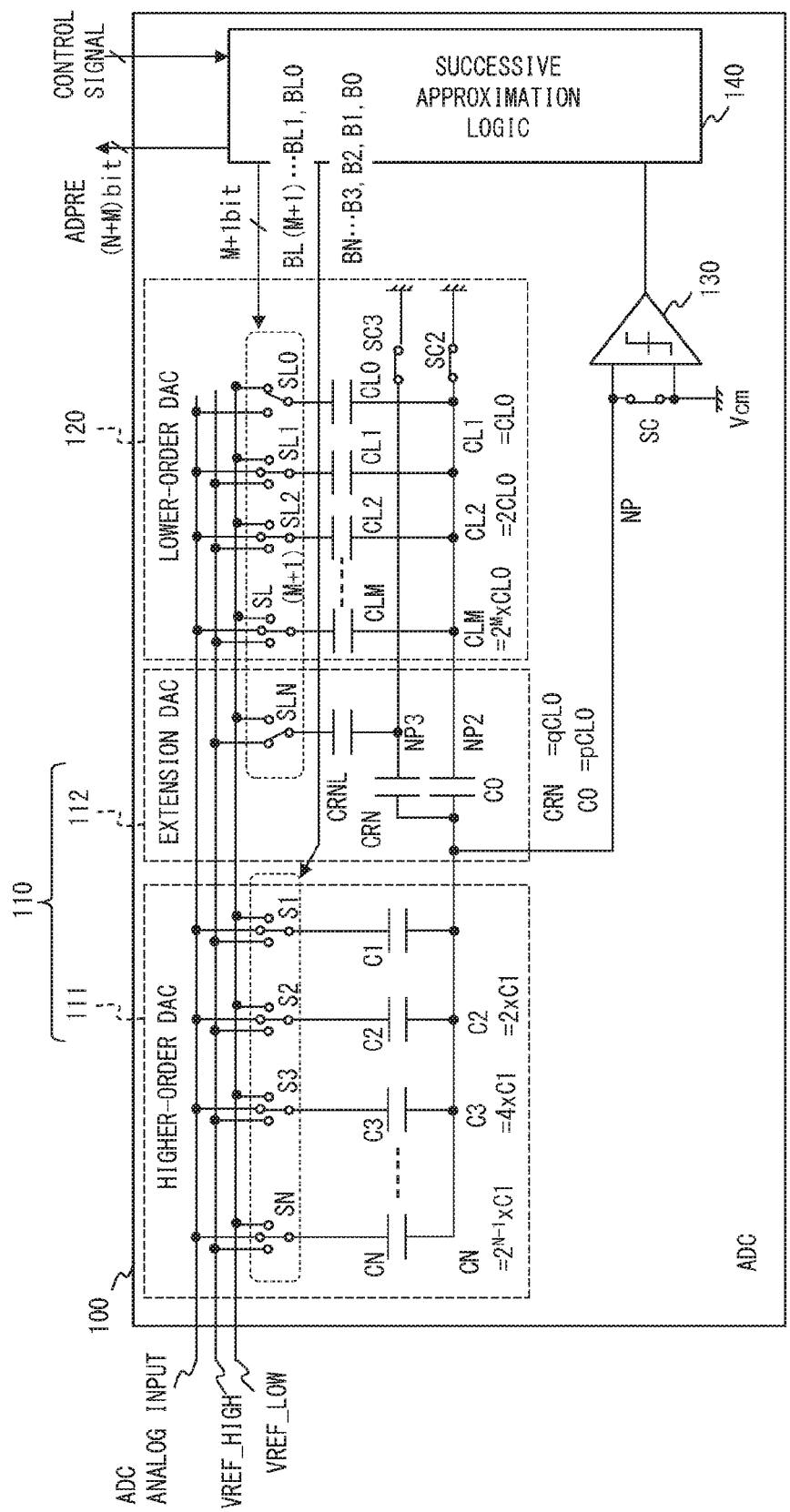
FIG. 15 is a block diagram showing a still another configuration example of the ADC according to the second embodiment.

FIG. 15 shows a still another configuration example of the ADC using the lower-order DAC having the cascade coupling capacitance configuration. In the example shown in FIG. 15, the extension DAC 112 shown in FIG. 13 is coupled with the capacitor element C0 and the capacitor element CRP is abolished. Further, the capacitor element CRN has the cascade coupling capacitance configuration. Since the configuration uses a combination of the lower-order DAC 120 and the extension DAC 112, for example, the capacitor element C0, the capacitor elements CLM to CL2, CL1, and CL0, which are connected to the capacitor element C0, switches SL(M+1) to SL1 and CL0, and capacitor elements CRN and CRNL constitute the lower-order DAC. The configuration including the capacitor elements CRN and CRNL and a switch SLN is also referred to as the extension DAC 112, and the configuration including the capacitor elements CLM to CL0 and the switches SL(M+1) to SL0 is also referred to as the lower-order DAC.

The capacitor element C0 is connected to a common node between the capacitor elements CN to C1. The capacitor elements CLM to CL0 are connected in parallel between the switches SL(M+1) to SL0 and the capacitor element C0. The switches SL(M+1) to SL0 are provided between the capacitor elements CLM to CL0 and each of the input terminal for the ADC analog input signal, the supply terminal for the reference voltage VREF_HIGH, and the supply terminal for the reference voltage VREF_LOW. The switch SC2 is provided between the reference voltage and a common node between the capacitor element C0 and the capacitor elements CLM to CL0.

The capacitor element CRN is connected to the common node between the capacitor elements CN to C1. The capacitor element CRNL is provided between the switch SLN and the capacitor element CRN. The switch SLN is provided between the capacitor element CRNL and each of the supply terminal for the reference voltage VREF_HIGH and the supply terminal for the reference voltage VREF_LOW. A switch SC3 is provided between the reference voltage and a common node between the capacitor elements CRN and CRNL. In this example, a node between the capacitor element C1 and the capacitor elements C0 and CRN is connected to one input terminal (node NP) of the comparator 130.

Assuming herein that the transfer function for obtaining the amount of charge transferred by switching of the capacitances of the capacitor elements CLM to CL1 through the capacitor element C0 is represented by γ, the charge transfer amount QCLM of the capacitor CLM can be expressed in the same manner as the formula (24).

$$|QCLM|=\gamma CLM \times |VREF\_HIGH-VREF\_LOW|= \gamma 2^{M-1} \times |VREF\_HIGH-VREF\_LOW| \quad (29)$$

In this case, the formula for $\gamma_i$ representing the ideal transfer function γ is the same as the formula (25), and the relation between the transfer function and the parasitic capacitance connected to the node NP2 is the same as the relation expressed by the formula (27) using α. The transfer function γ has the same constraint as that in the formula (28).

As the value of the transfer function γ increases, the redundancy increases. For example, in the case of $\gamma 2^M C0/C1=2$, the redundancy corresponding to the capacitance C0 of the higher-order DAC 111 is provided. However, the resolution of the lower-order DAC 120 is reduced by one bit. The negative-polarity-side extension DAC may be configured in the same manner as the capacitance C0. Assuming that a transfer function to be transmitted to the node NP through the capacitor element CRN is represented by γ', it is necessary to satisfy the following relation to ensure a continuous output of analog values from the DAC.

$$\gamma \geq \gamma' \quad (30)$$

The error ε, which is a correction coefficient, can be calculated by a method similar to that of the first embodiment. The capacitance C0 in the first embodiment can be substituted as follows.

$$C0 \rightarrow 2^M \gamma CL0 \quad (31)$$

$$CRN \rightarrow 2^M \gamma' CL0 \quad (32)$$

At this time, the method for deriving the error value of the capacitance in the first embodiment is changed as follows. For example, in the successive approximation conversion result ADPRE before correction as expressed by the formula (1), the term of BRP vanishes, and the following formula is obtained.

$$ADPRE=2^{(N-1+M)}*BN+2^{(N-2+M)}*B(N-1)+\ldots+ 2^{(1+M)}*B2+2^M*B1-2^M*BRN+2^{(N-1)}* BLM+\ldots+2^0*BL1 \quad (33)$$

Similarly, the error correction value ADERR can be expressed as follows.

$$ADERR=\epsilon N*BN+\epsilon(N-1)*B(N-1)+\ldots+\epsilon 2*B2+ \epsilon 1*B1-\epsilon RN*BRN+\epsilon 0*(BLSB) \quad (34)$$

The error ε based on the capacitance C0 can be expressed by formulas (8.1) to (8.5) and (8.7) in the same manner as in the first embodiment. The formulas in the second embodiment differ from the formulas in the first embodiment in that the term of εRP is not required.

$$\epsilon 1=C0-C1=-E1 \quad (8.1)$$

$$\epsilon 2=2C0-C2=-(E1+E2) \quad (8.2)$$

$$\epsilon 3=4C0-C3=-(2E1+E2+E3) \quad (8.3)$$

$$\epsilon 4=8C0-C4=-(4E1+2E2+E3+E4) \quad (8.4)$$

$$\epsilon N=2^{(N-1)}*C0-CN=-(2^{(N-2)}E1+2^{(N-3)}E2+ 2^{(N-4)}E3+\ldots+2E(N-2)+E(N-1)+EN) \quad (8.5)$$

$$\epsilon RN=C0-CRN=-ERN \quad (8.7)$$

The error ε is obtained by the above formulas and the obtained error ε is stored in the register 9, which makes it possible to correct the AD conversion result in the circuit shown in FIG. 8. At this time, the formula. (34) is modified as follows.

$$ADERR=\epsilon N*BN+\epsilon(N-1)*B(N-1)+\ldots+\epsilon 2*B2+ \epsilon 1*B1-\epsilon RN*BRN \quad (35)$$

The calculation of the error based on the full-scale capacitance can be performed in the same manner as in the first embodiment. The error correction value ADERR is the same as that expressed by the formula (34). In this case, εRP is not required, and thus the calculations of the formulas (13.3) and (16.3) are not required.

Figure 16:
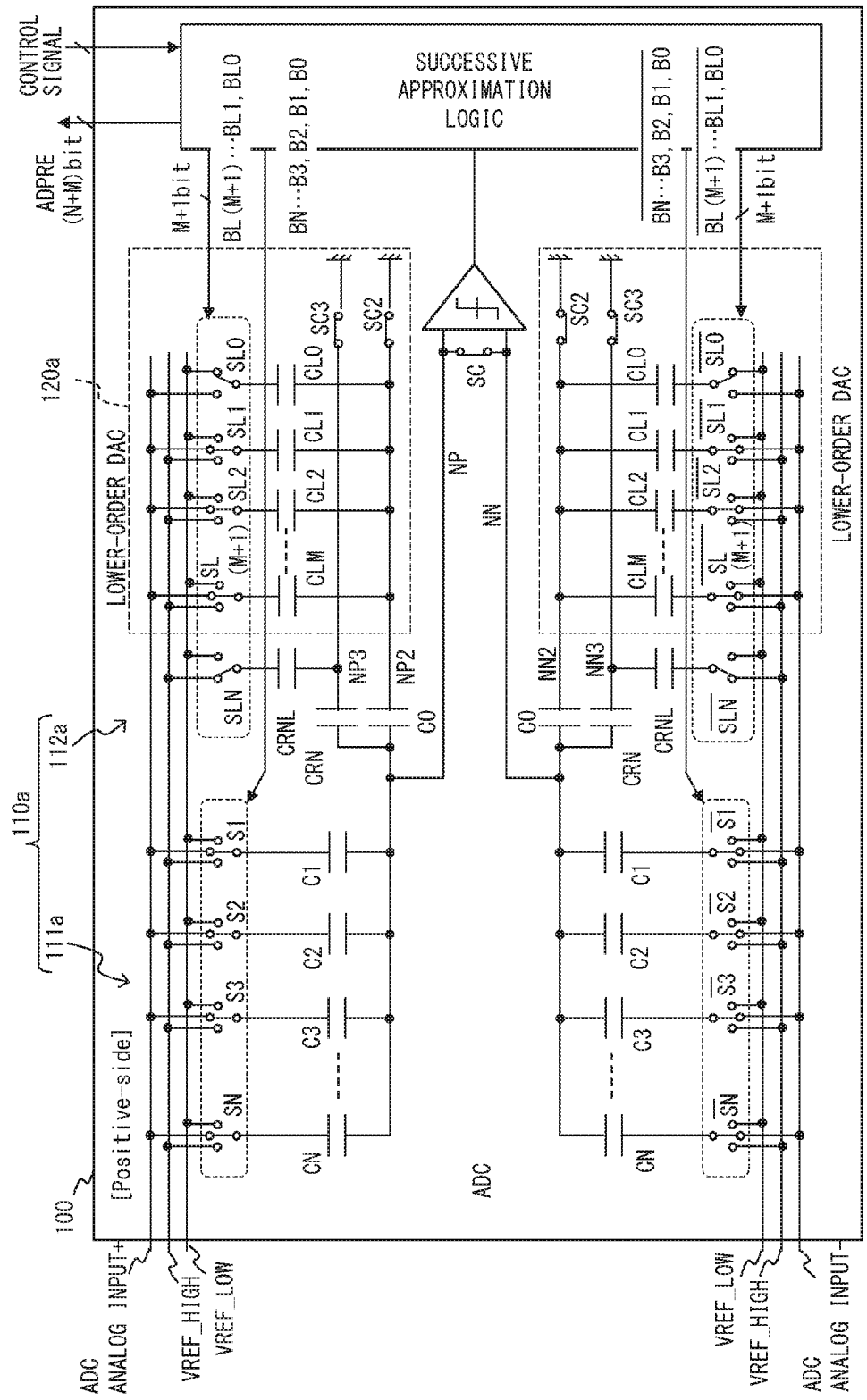
FIG. 16 is a block diagram showing still one more configuration example of the ADC according to the second embodiment.

Similarly to the first embodiment and FIG. 14, the ADC shown in FIG. 15 may be implemented using a fully-differential configuration as shown in FIG. 16. Like in the example shown in FIG. 14, the example shown in FIG. 16 includes the local DAC 110a, the lower-order DAC 120a, the local DAC 110b, the lower-order DAC 120b, the comparator 130, and the successive approximation logic 140. The lower-order DAC 120a and the lower-order DAC 120b are coupled with the extension DAC, like in the example shown in FIG. 15.

As described above, even when the ADC of the first embodiment is configured using the cascade coupling capacitance configuration, a high accuracy and an improvement in processing speed can be achieved, like in the first embodiment. FIGS. 13 to 16 each show an example of the ADC using the cascade coupling capacitance configuration, and the layout and circuit configuration of the extension DAC can be changed as in other embodiments.

Third Embodiment

In a third embodiment, a configuration example of a comparator offset cancel circuit used during derivation of an error will be described. The components of the third embodiment other than the offset cancel circuit are similar to those of the first and second embodiments.

Figure 17:
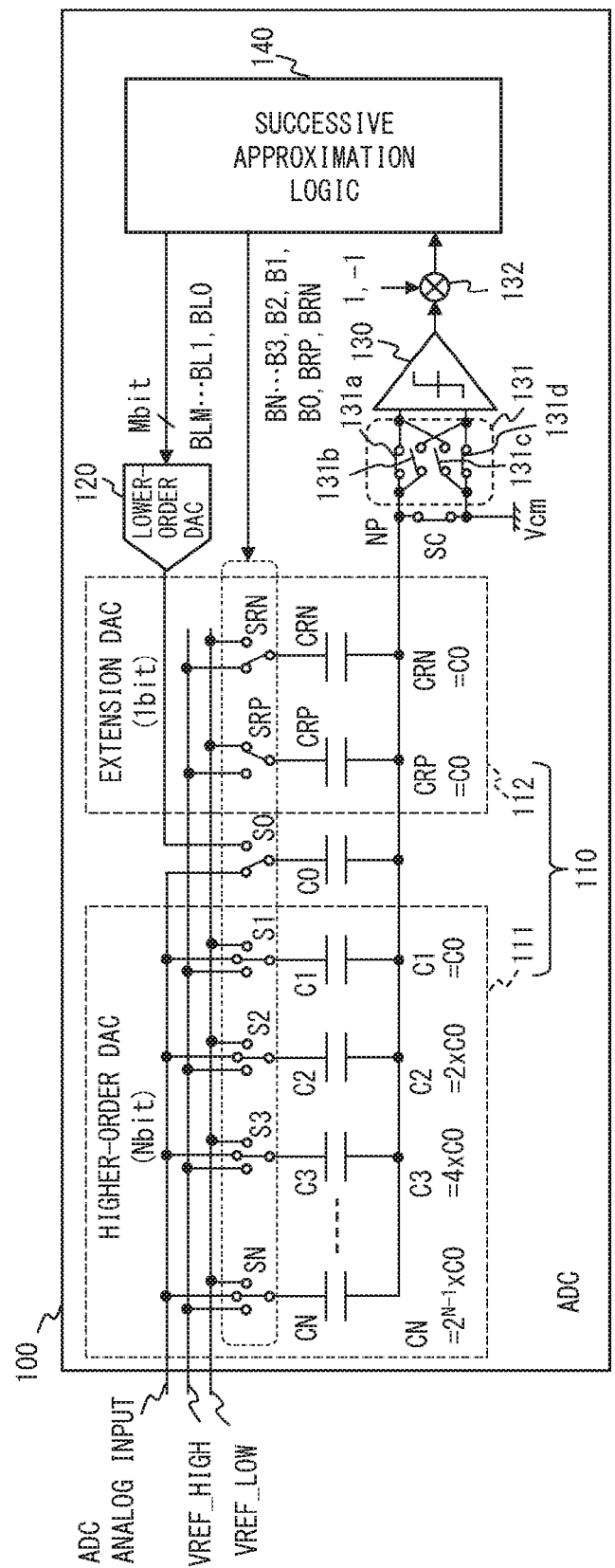
FIG. 17 is a block diagram showing a configuration example of an ADC according to a third embodiment.

FIG. 17 shows an example in which a chopping circuit is used as the comparator offset cancel circuit. For example, the comparator offset cancel circuit used during introduction of an error can also be implemented using the chopping circuit shown in FIG. 17. An offset can be cancelled by an operation in which the chopping circuit replaces the input and output polarities for an even number of conversions by the input and output polarities for an odd number of conversions.

In the example shown in FIG. 17, a chopping switch 131 and a multiplier 132 are provided as the offset cancel circuit. The chopping switch 131 includes switches 131a to 131d. The connections among the two input terminals of the comparator 130, the node NP, and the reference voltages are switched by switching the switches 131a to 131d of the chopping switch 131, and the multiplier 32 inverts the polarity according to the switching operation.

Figure 18:
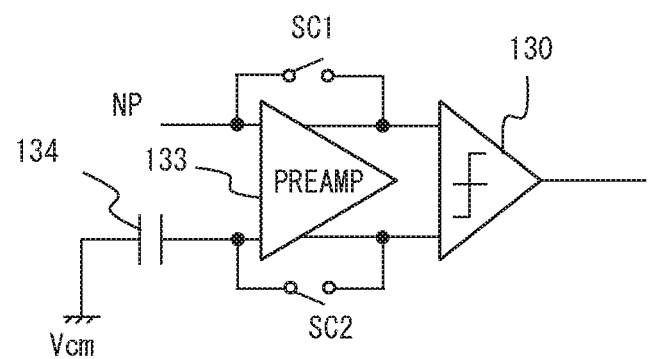
FIG. 18 is a block diagram showing a configuration example of an offset cancel circuit according to the third embodiment.

FIG. 18 shows an example in which an auto-zero circuit is used as the comparator offset cancel circuit. As shown in FIG. 18, for example, the offset cancel circuit includes a preamplifier 133, a capacitor element 134, which is provided at a pre-stage of the preamplifier, and switches SC1 and SC2. During sampling, the switches SC1 and SC2 are turned on to charge the capacitor element 134 with an offset. During successive approximation, the switches SC1 and SC2 are turned off and the comparator 130 performs the comparison by taking into consideration the voltage of the capacitor element 134 via the preamplifier 133, thereby correcting the offset.

Figure 19:
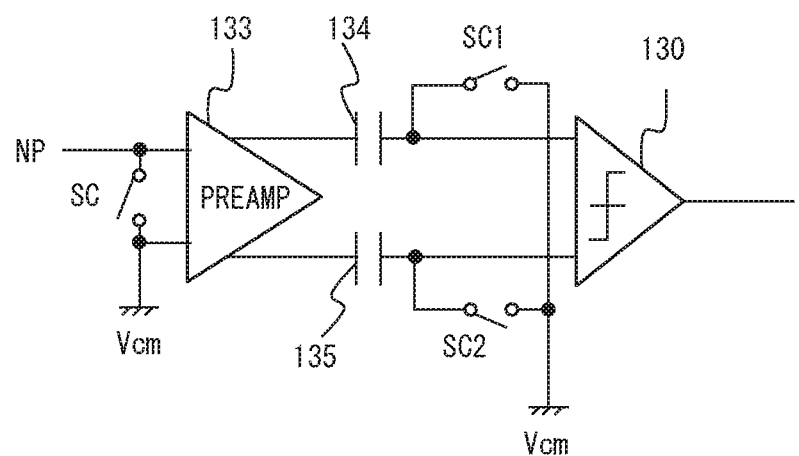
FIG. 19 is a block diagram showing another configuration example of the offset cancel circuit according to the third embodiment.

FIG. 19 shows an example in which an output offset storage circuit is used as the comparator offset cancel circuit. As shown in FIG. 19, for example, the offset cancel circuit includes the preamplifier 133, the capacitor elements 134 and 135, which are provided at a subsequent stage of the preamplifier, and the switches SC1 and SC2. During sampling, the switches SC1 and SC2 are turned on to charge the capacitor elements 134 and 135 with an offset. During successive approximation, the switches SC1 and SC2 are turned off and the comparator 130 performs the comparison by taking into consideration the voltages of the capacitor elements 134 and 135 via the preamplifier 133, thereby correcting the offset.

In this manner, the offset of the comparator can be reduced by the comparator offset cancel circuit provided in the configurations of the first and second embodiments, which leads to a further improvement in the accuracy of AD conversion.

The invention made by the present inventors has been described in detail above. However, the present invention is not limited to the embodiments described above and can be modified in various ways without departing from the scope of the invention.

The first to third embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:
1. An AD converter comprising:
   a higher-order DAC that samples an analog input signal and performs DA conversion corresponding to higher-order bits of a digital output signal;
   an extension DAC that performs DA conversion to positive and negative polarities on an extension bit for expanding bits of the higher-order DAC;
   a lower-order DAC that performs DA conversion corresponding to lower-order bits of the digital output signal;
   a comparator that compares a comparison reference voltage with an output voltage of each of the higher-order DAC, the extension DAC, and the lower-order DAC; and
   a successive approximation logic circuit that controls successive approximation performed by the higher-order DAC, the extension DAC, and the lower-order DAC based on a comparison result of the comparator, and generates the digital output signal.
2. The AD converter according to claim 1, wherein the higher-order DAC includes:
   a higher-order switch group connected to any one of an input terminal for the analog input signal, a supply terminal for a first reference voltage, and a supply terminal for a second reference voltage; and
   a higher-order capacitor element group that is provided between the higher-order switch group and the comparator and has a capacitance weighted by a power of two, and
   the extension DAC includes:
   an extension switch connected to one of a supply node of the first reference voltage and a supply node of the second reference voltage; and
   an extension capacitor element that is provided between the extension switch and the comparator and has a capacitance equal to that of any one of capacitor elements of the higher-order capacitor element group.
3. The AD converter according to claim 2, wherein the extension DAC includes, as the extension capacitor element, a first extension capacitor element having a positive polarity and a second extension capacitor element having a negative polarity.

4. The AD converter according to claim 2, further comprising:
a coupling switch connected to one of the input terminal for the analog input signal and an output terminal of the lower-order DAC; and
a coupling capacitor element that is provided between the coupling switch and the comparator and has a capacitance equal to that of a capacitor element at a least significant bit of the higher-order capacitor element group.

5. The AD converter according to claim 2, wherein the lower-order DAC includes:
a lower-order switch group connected to one of the input terminal for the analog input signal, the supply terminal for the first reference voltage, and the supply terminal for the second reference voltage;
a lower-order capacitor element group that is provided between the lower-order switch group and the comparator and has a capacitance weighted by a power of two; and
a coupling capacitor element that couples the higher-order capacitor element group and the extension capacitor element with the lower-order capacitor element group.

6. The AD converter according to claim 5, wherein the extension DAC includes:
first and second extension switches each connected to one of the supply node of the first reference voltage and the supply node of the second reference voltage; and
first and second extension capacitor elements provided between the comparator and the first and second extension switches.

7. The AD converter according to claim 5, wherein the extension DAC includes first and second extension capacitor elements provided between the extension switch and the comparator.

8. The AD converter according to claim 1, further comprising a second higher-order DAC, a second extension DAC, and a second lower-order DAC which form a differential circuit together with the higher-order DAC, the extension DAC, and the lower-order DAC.

9. The AD converter according to claim 1, further comprising an offset cancel circuit that cancels an offset of the comparator.

10. The AD converter according to claim 9, wherein the offset cancel circuit is a chopping circuit including a chopping switch.

11. The AD converter according to claim 9, wherein the offset cancel circuit is an auto-zero circuit including a capacitor that is provided at a pre-stage of an amplifier circuit and charges an offset.

12. The AD converter according to claim 9, wherein the offset cancel circuit is an output offset storage circuit including a capacitor that is provided at a subsequent stage of an amplifier circuit and charges an offset.

13. An AD convert apparatus comprising:
an AD converter that performs AD conversion of an analog input signal to a digital output signal;
a storage unit that stores an error of the AD converter; and
a correction unit that corrects the digital output signal based on the stored error,
wherein the AD converter includes:
a higher-order DAC that samples the analog input signal and performs DA conversion corresponding to higher-order bits of the digital output signal;
an extension DAC that performs DA conversion to positive and negative polarities on an extension bit for expanding bits of the higher-order DAC;
a lower-order DAC that performs DA conversion corresponding to lower-order bits of the digital output signal;
a comparator that compares a comparison reference voltage with an output voltage of each of the higher-order DAC, the extension DAC, and the lower-order DAC; and
a successive approximation logic circuit that controls successive approximation performed by the higher-order DAC, the extension DAC, and the lower-order DAC based on a comparison result of the comparator, and generates the digital output signal.

14. The AD convert apparatus according to claim 13, wherein
each of the higher-order DAC and the extension DAC is a capacitive DAC including a plurality of capacitor elements, and
the error is an error of each capacitance of the plurality of capacitor elements based on a capacitance of a reference capacitor element.

15. The AD convert apparatus according to claim 13, wherein
each of the higher-order DAC and the extension DAC is a capacitive DAC including a plurality of capacitor elements, and
the error is an error of each capacitance of the plurality of capacitor elements based on the capacitances of the plurality of capacitor elements.

16. The AD convert apparatus according to claim 13, wherein the correction unit includes:
a correction value calculating unit that acquires the stored error and calculates a correction value corresponding to a bit of the digital output signal; and
a subtraction unit that subtracts the calculated correction value from the digital output signal.

17. The AD convert apparatus according to claim 16, wherein the correction unit includes a gain correction unit that corrects a gain of a signal obtained as a result of the subtraction.

18. The AD convert apparatus according to claim 13, wherein the correction unit performs correction for each bit of the digital output signal, and outputs a corrected signal for each bit.

19. An AD convert method comprising:
sampling an analog input signal and performing DA conversion corresponding to higher-order bits of a digital output signal;
performing DA conversion to positive and negative polarities on an extension bit for expanding the higher-order bits;
performing DA conversion corresponding to lower-order bits of the digital output signal;
comparing a comparison reference voltage with each of a voltage obtained by the DA conversion corresponding to the higher-order bits, a voltage obtained by the DA conversion corresponding to the extension bit, and a voltage obtained by the DA conversion corresponding to the lower-order bits; and controlling successive approximation performed using the higher-order bits, the extension bit, and the lower-order bits based on the comparison result, and generating the digital output signal.

\* \* \* \* \*